(12) United States Patent
Gunnam

(10) Patent No.: US 8,464,129 B2
(45) Date of Patent: Jun. 11, 2013

(54) ROM LIST-DECODING OF NEAR CODEWORDS

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 120 days.

(21) Appl. No.: 12/677,322

(22) PCT Filed: Dec. 12, 2008

(86) PCT No.: PCT/US2008/086537
§ 371 (c)(1),
(2), (4) Date: Mar. 10, 2010

(87) PCT Pub. No.: WO2010/019169
PCT Pub. Date: Feb. 18, 2010

(65) Prior Publication Data
US 2011/0126075 A1 May 26, 2011

Related U.S. Application Data

(60) Provisional application No. 61/089,297, filed on Aug. 15, 2008.

(51) Int. Cl.
*H03M 13/11* (2006.01)
(52) U.S. Cl.
USPC .......................................................... 714/759
(58) Field of Classification Search
USPC .......................................................... 714/759
See application file for complete search history.

(56) References Cited

U.S. PATENT DOCUMENTS

| | | | |
|---|---|---|---|
| 3,755,779 A | 8/1973 | Price | |
| 4,295,218 A * | 10/1981 | Tanner | .......................... 714/762 |
| 5,048,060 A | 9/1991 | Arai et al. | |
| 5,721,745 A | 2/1998 | Hladik et al. | |
| 5,734,962 A | 3/1998 | Hladik et al. | |
| 6,023,783 A | 2/2000 | Divsalar et al. | |
| 6,236,686 B1 | 5/2001 | Kamishima | |

(Continued)

FOREIGN PATENT DOCUMENTS

| | | |
|---|---|---|
| CN | 101032082 A | 9/2007 |
| JP | 2007036495 A | 11/2007 |

(Continued)

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.

(Continued)

*Primary Examiner* — Stephen M Baker
(74) *Attorney, Agent, or Firm* — Mendelsohn, Drucker & Associates, P.C.; Craig M. Brown; Steve Mendelsohn

(57) ABSTRACT

Certain embodiments of the present invention are methods for the organization of trapping-set profiles in ROM and for the searching of those profiles during (LDPC) list decoding. Profiles are ranked by dominance, i.e., by their impact on the error-floor characteristics of a decoder. More-dominant trapping-set profiles contain information about both unsatisfied check nodes (USCs) and mis-satisfied check nodes (MSCs), while less-dominant trapping-set profiles contain information about only USCs. Trapping-set profile information is organized into a number of linked, hierarchical data tables which allow for the rapid location and retrieval of most-dominant matching trapping-set profiles using a pointer-chase search.

18 Claims, 16 Drawing Sheets

U.S. PATENT DOCUMENTS

| | | | |
|---|---|---|---|
| 6,307,901 B1 | 10/2001 | Yu et al. | |
| 6,550,023 B1 | 4/2003 | Brauch et al. | |
| 6,678,843 B2 | 1/2004 | Giulietti et al. | |
| 6,745,157 B1 | 6/2004 | Weiss et al. | |
| 6,760,879 B2 | 7/2004 | Giese et al. | |
| 6,888,897 B1 | 5/2005 | Nazari et al. | |
| 6,910,000 B1 | 6/2005 | Yedidia et al. | |
| 7,181,676 B2 | 2/2007 | Hocevar | |
| 7,219,288 B2 | 5/2007 | Dielissen et al. | |
| 7,237,181 B2 | 6/2007 | Richardson | |
| 7,296,216 B2 | 11/2007 | Shen et al. | |
| 7,340,671 B2 | 3/2008 | Jones et al. | |
| 7,353,444 B2 | 4/2008 | Owsley et al. | |
| 7,457,367 B2 | 11/2008 | Farhang-Boroujeny et al. | |
| 7,689,888 B2 * | 3/2010 | Kan et al. | 714/758 |
| 7,725,800 B2 * | 5/2010 | Yang et al. | 714/755 |
| 7,730,377 B2 | 6/2010 | Hocevar | |
| 7,739,558 B1 * | 6/2010 | Farjadrad et al. | 714/704 |
| 7,752,523 B1 | 7/2010 | Chaichanavong et al. | |
| 7,770,090 B1 | 8/2010 | Kons et al. | |
| 7,805,642 B1 | 9/2010 | Farjadrad | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 * | 5/2011 | Park et al. | 714/762 |
| 8,010,869 B2 | 8/2011 | Wejn et al. | |
| 8,020,070 B2 | 9/2011 | Langner et al. | |
| 8,037,394 B2 * | 10/2011 | Djurdjevic et al. | 714/780 |
| 8,046,658 B2 | 10/2011 | Heinrich et al. | |
| 8,051,363 B1 * | 11/2011 | Liu | 714/780 |
| 8,103,931 B2 * | 1/2012 | Wang et al. | 714/755 |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 8,157,163 B1 | 4/2012 | Graef | |
| 8,171,367 B2 | 5/2012 | Gao et al. | |
| 8,205,134 B2 * | 6/2012 | Harrison et al. | 714/758 |
| 8,205,144 B1 * | 6/2012 | Yadav | 714/785 |
| 8,214,719 B1 | 7/2012 | Sheng et al. | |
| 8,219,878 B1 * | 7/2012 | Varnica et al. | 714/758 |
| 8,255,763 B1 * | 8/2012 | Yang et al. | 714/758 |
| 8,301,984 B1 | 10/2012 | Zhang et al. | |
| 2002/0062468 A1 | 5/2002 | Nagase et al. | |
| 2002/0166095 A1 | 11/2002 | Lavi et al. | |
| 2005/0132260 A1 | 6/2005 | Kyung et al. | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0013306 A1 | 1/2006 | Kim et al. | |
| 2006/0031744 A1 | 2/2006 | Blankenship | |
| 2006/0036928 A1 | 2/2006 | Eroz et al. | |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0049869 A1 | 2/2008 | Heinrich et al. | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastras-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2009/0063931 A1 | 3/2009 | Rovini et al. | |
| 2009/0083609 A1 | 3/2009 | Yue et al. | |
| 2009/0132897 A1 | 5/2009 | Xu et al. | |
| 2009/0150745 A1 | 6/2009 | Langner et al. | |
| 2009/0235146 A1 | 9/2009 | Tan et al. | |
| 2009/0259912 A1 | 10/2009 | Djordjevic et al. | |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1 | 2/2010 | Jin et al. | |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0058152 A1 | 3/2010 | Harada | |
| 2010/0088575 A1 | 4/2010 | Sharon et al. | |
| 2010/0192043 A1 | 7/2010 | Alrod et al. | |
| 2011/0041029 A1 | 2/2011 | Yedidia et al. | |
| 2012/0135285 A1 | 5/2012 | Iwama et al. | |
| 2012/0139074 A1 | 6/2012 | Abe | |

FOREIGN PATENT DOCUMENTS

| | | |
|---|---|---|
| JP | 2009100222 A | 5/2009 |
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005, pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,pp. 90.

T. Richardson and R. Urbanke—"Modern Coding Theory", Cambridge University Press, Preliminary version—Oct. 18, 2007, pp. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters 13th Mar. 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate—½ Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981,pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Examination Report; Mailed on Jul. 12, 2011 for the corresponding European Application No. 08 876 723.1.

Sripimanwat, K., "Turbo Code Applications: A Journey From a Paper to Realization", Oct. 26, 2005, Springer, p. 27.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Supplementary European Search Report and Written Opinion in EP 08 87 6723 (dated Jun. 22, 2010) (Published as EP20080876723 on May 5, 2010).

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

C. A. Cole, S. G. Wilson, E. K. Hall and T. R. Giallorenzi, "A General Method for Finding Low Error Rates of LDPC Codes," http://arxiv.org/abs/cs.IT/0605051.

D. MacKay and M. Postol, "Weaknesses of margulis and ramanujan-margulis low-density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

Chinese Office Action mailed on Nov. 23, 2012 for the corresponding CN Appl. #200880106457.3.

Casado, V., et al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic, P., et al., "Optimized Message Passing Schedules for LDPC Decoding," Conference Record of the Thirty-Ninth Asilomar conference on Signals, Systems and Computers, Oct. 28-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

* cited by examiner

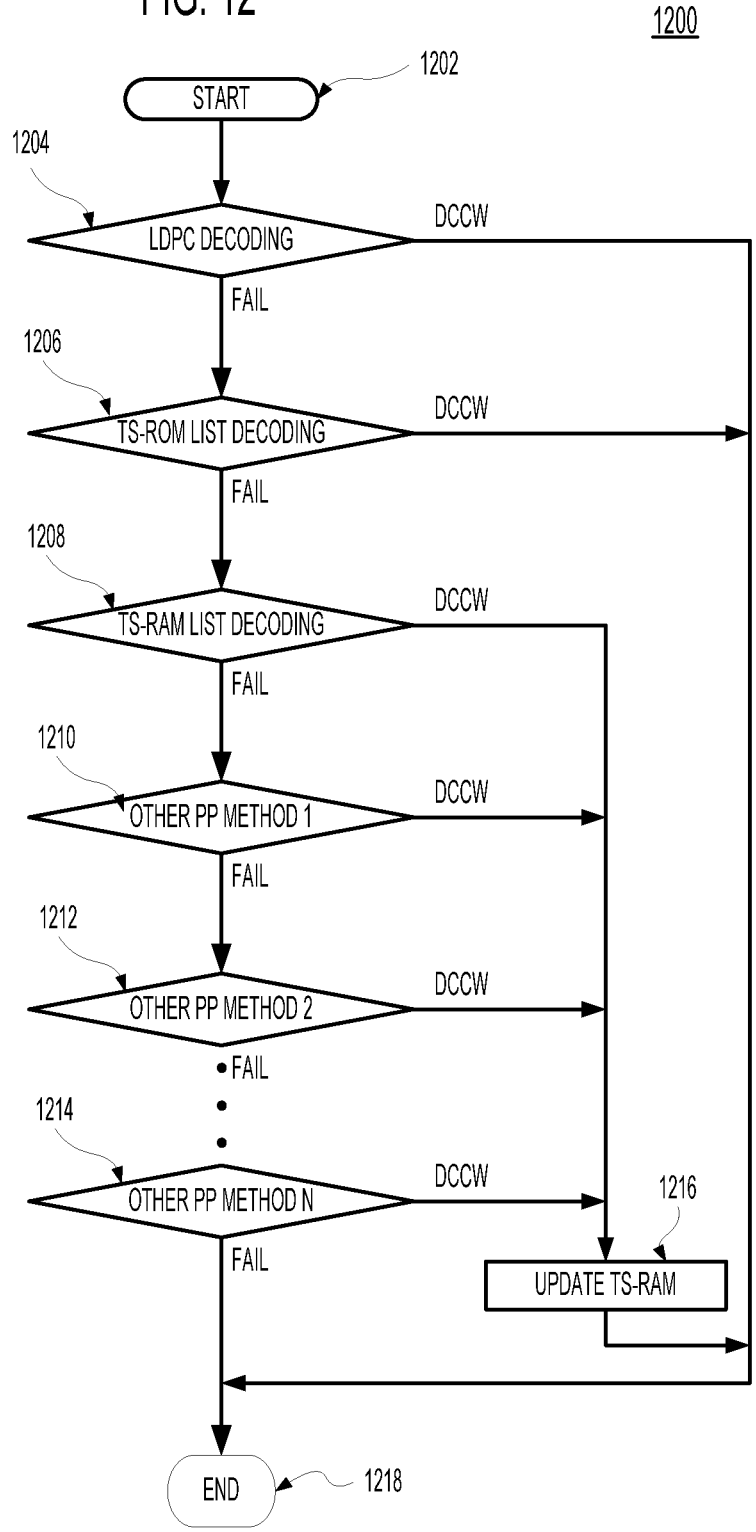

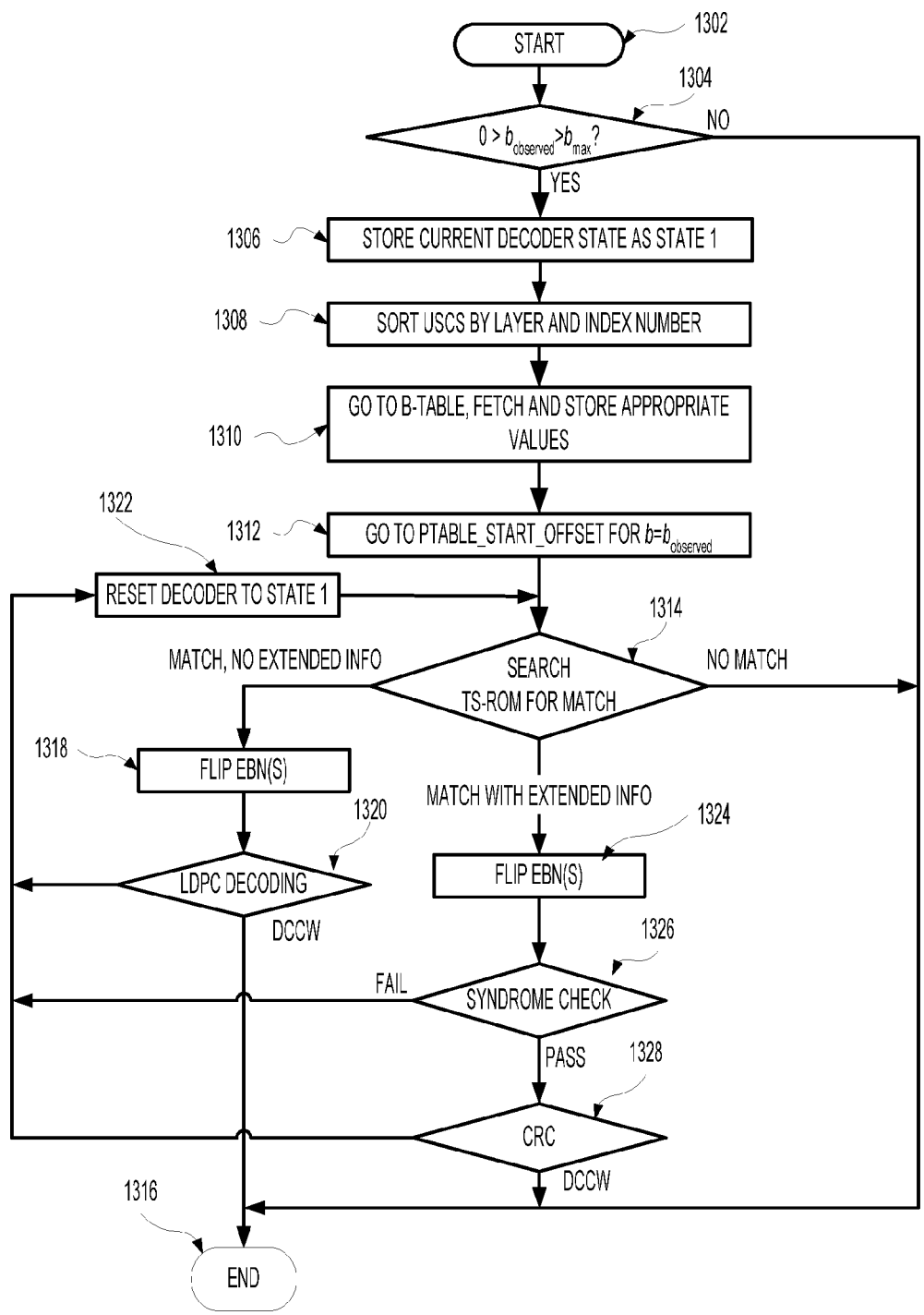

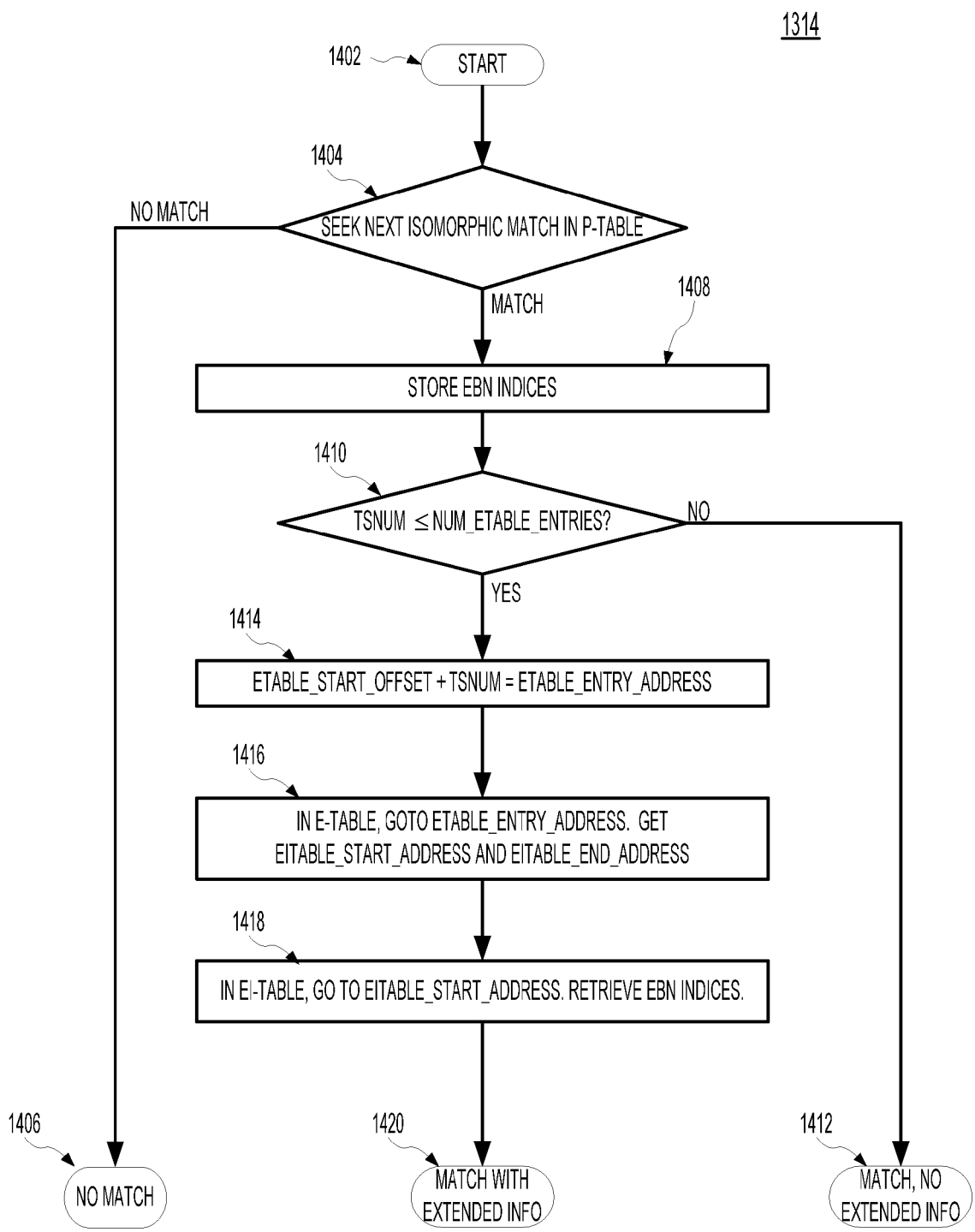

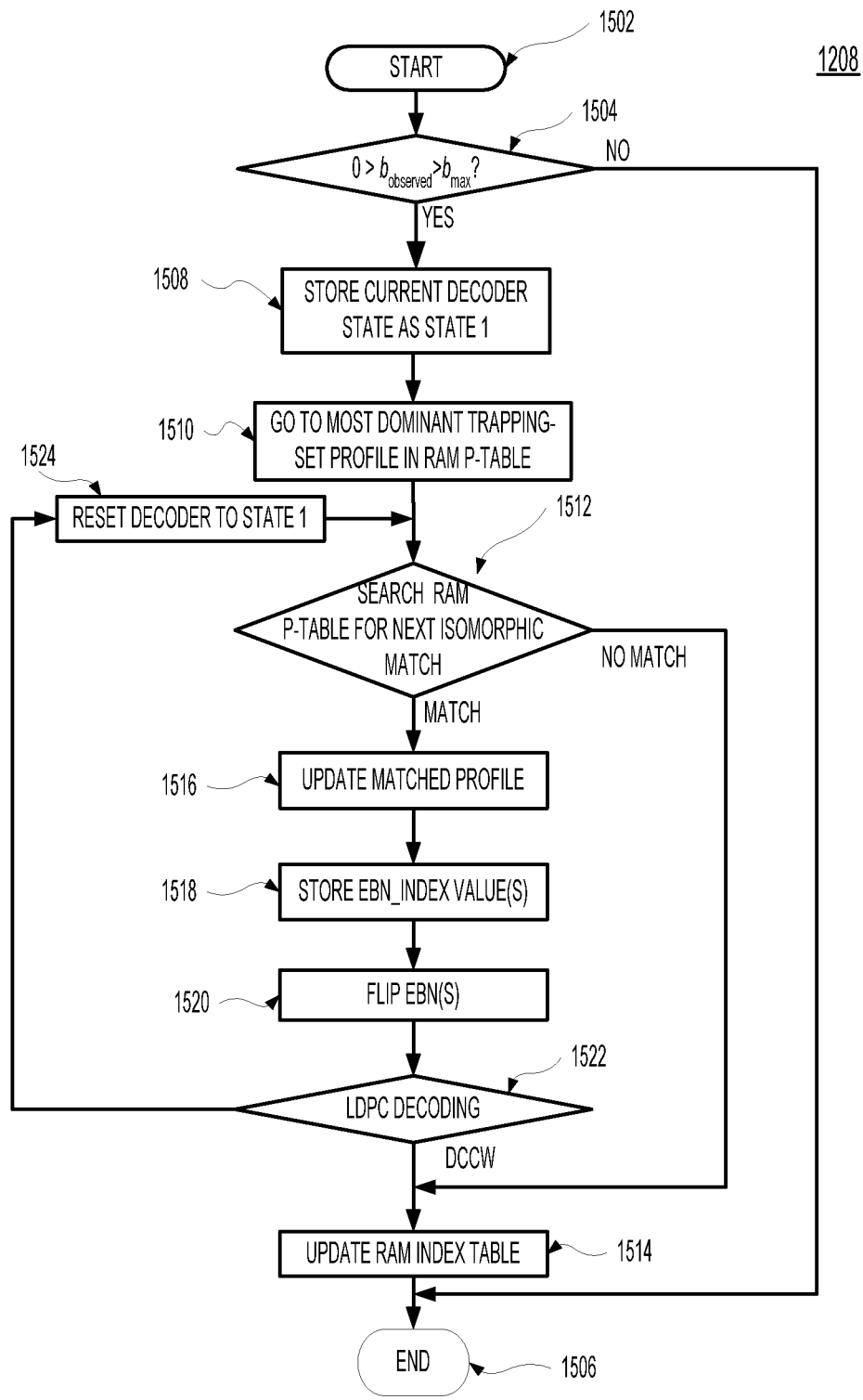

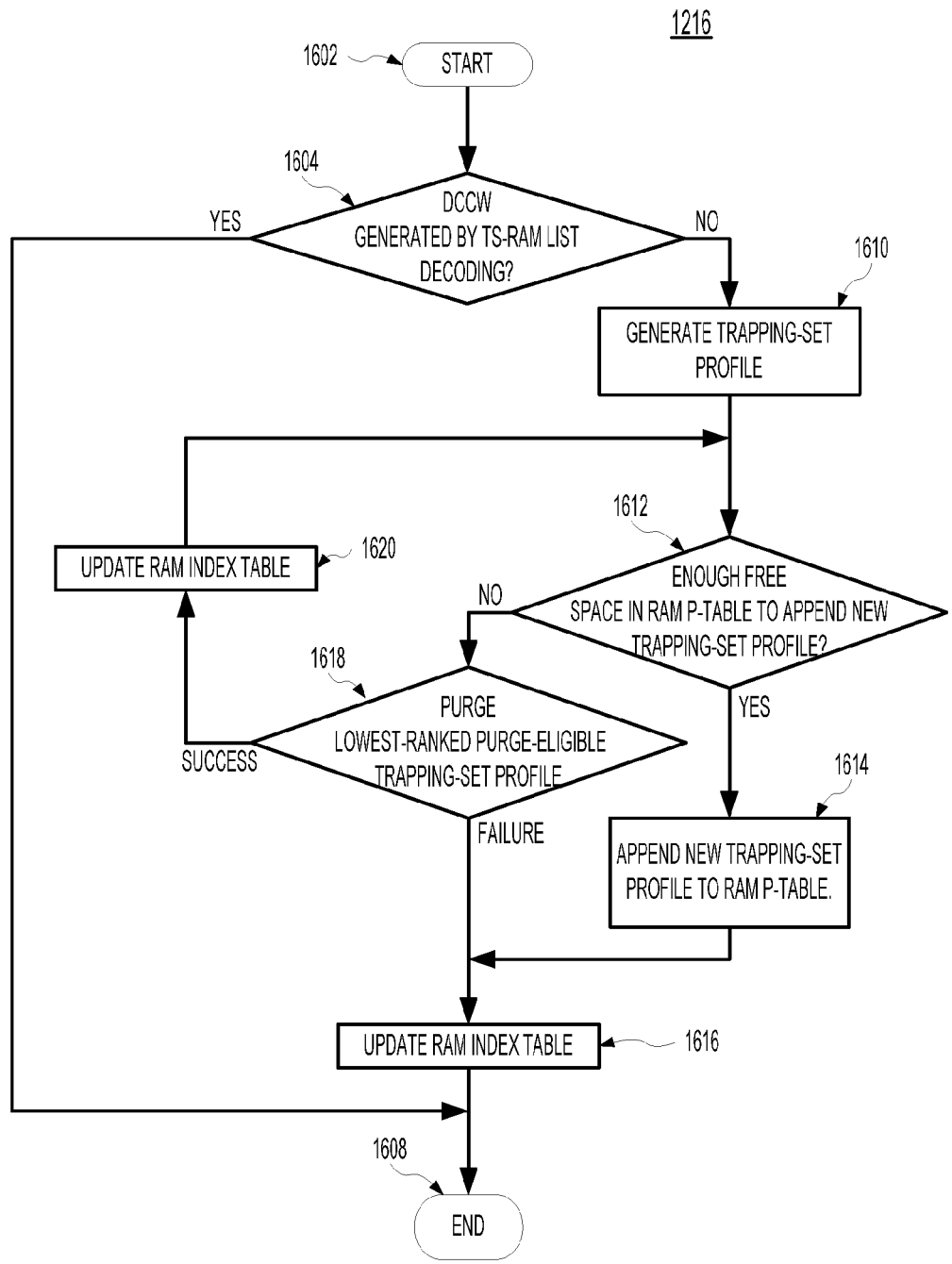

ROM LIST-DECODING OF NEAR CODEWORDS

CROSS-REFERENCE TO RELATED APPLICATIONS

This application claims the benefit of the filing date of U.S. provisional application No. 61/089,297, filed on Aug. 15, 2008, the teachings of which are incorporated herein by reference in its entirety.

The subject matter of this application is related to PCT patent application no. PCT/US2008/086523 filed on Dec. 12, 2008, the teachings of which are incorporated herein by reference in their entirety.

BACKGROUND OF THE INVENTION

1. Field of the Invention

The invention relates to digital signal processing, and, in particular, to a data-encoding method known as low-density parity check (LDPC) coding.

2. Description of the Related Art

Communication is the transmission of information by a transmitter to a receiver over a communications channel. In the real world, the communications channel is a noisy channel, outputting to the receiver a distorted version of the information received from the transmitter. A hard disk (HD) drive is one such noisy channel, accepting information from a transmitter, storing that information, and then, possibly, transmitting a more or less distorted copy of that information to a receiver.

The distortion introduced by a communications channel such as an HD drive might be great enough to cause a channel error, i.e., where the receiver interprets the channel output signal as a 1 when the channel input signal was a 0, and vice versa. Channel errors reduce throughput, and are thus undesirable. Hence, there is an ongoing need for tools which detect and/or correct channel errors. Low-density parity check (LDPC) coding is one method for the detection and correction of channel errors. LDPC codes are among the known near-Shannon-limit codes that can achieve very low bit-error rates (BER) for low signal-to-noise ratio (SNR) applications. LDPC decoding is distinguished by its potential for parallelization, low implementation complexity, low decoding latency, as well as less-severe error-floors at high SNRs. LDPC codes are considered for virtually all the next-generation communication standards.

SUMMARY OF THE INVENTION

In certain embodiments, the present invention comprises methods for decoding encoded data encoded using a graph-based code. The method comprises (a) decoding the encoded data to generate a candidate decoded codeword and (b) performing, if the candidate decoded codeword is not a decoded correct codeword, a trapping-set (TS)-ROM list decoding method to attempt to generate the decoded correct codeword. The candidate decoded codeword has at least one unsatisfied check node, wherein an unsatisfied check node is a check node that fails a parity check. The TS-ROM list-decoding method accesses one or more TS profiles stored in ROM memory. A first stored TS profile comprises stored information for at least one unsatisfied check (USC) node and stored information for at least one mis-satisfied check (MSC) node. An MSC node is a check node that (1) is associated with erroneous bit nodes (EBNs) and (2) satisfies the parity check. A second stored TS profile is associated with a trapping set having one or more USC nodes and one or more MSC nodes, wherein the second stored TS profile comprise stored information for the one or more USC nodes, but does not contain information about the one or more MSC nodes.

In other embodiments, the present invention is an apparatus for decoding encoded data encoded using a graph-based code. The apparatus comprises (a) a decoder adapted to decode the encoded data to generate a candidate decoded codeword and (b) a post-processor adapted to perform, if the candidate decoded codeword is not a decoded correct codeword, a trapping-set (TS)-ROM list decoding method to attempt to generate the decoded correct codeword. The candidate decoded codeword has at least one unsatisfied check node, wherein an unsatisfied check node is a check node that fails a parity check. The TS-ROM list-decoding method accesses one or more TS profiles stored in ROM memory. A first stored TS profile comprises stored information for at least one unsatisfied check (USC) node and stored information for at least one mis-satisfied check (MSC) node. An MSC node is a check node that (1) is associated with erroneous bit nodes (EBNs) and (2) satisfies the parity check. A second stored TS profile is associated with a trapping set having one or more USC nodes and one or more MSC nodes, wherein the second stored TS profile comprises stored information for the one or more USC nodes, but does not contain information about the one or more MSC nodes.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

FIG. 12 is a flowchart of exemplary process 1200 used by LDPC decoding system 500 of FIG. 5.

FIG. 13 is a flowchart of exemplary TS-ROM list-decoding process 1206 of FIG. 12 implemented by post-processor 504 of FIG. 5.

FIG. 14 is a flowchart of exemplary TS-ROM search process 1314 of FIG. 13.

FIG. 15 is a flowchart of exemplary TS-RAM list-decoding process 1208 of FIG. 12.

FIG. 16 is a flowchart of exemplary TS-RAM update process 1216 of FIG. 12.

DETAILED DESCRIPTION

Figure 1:
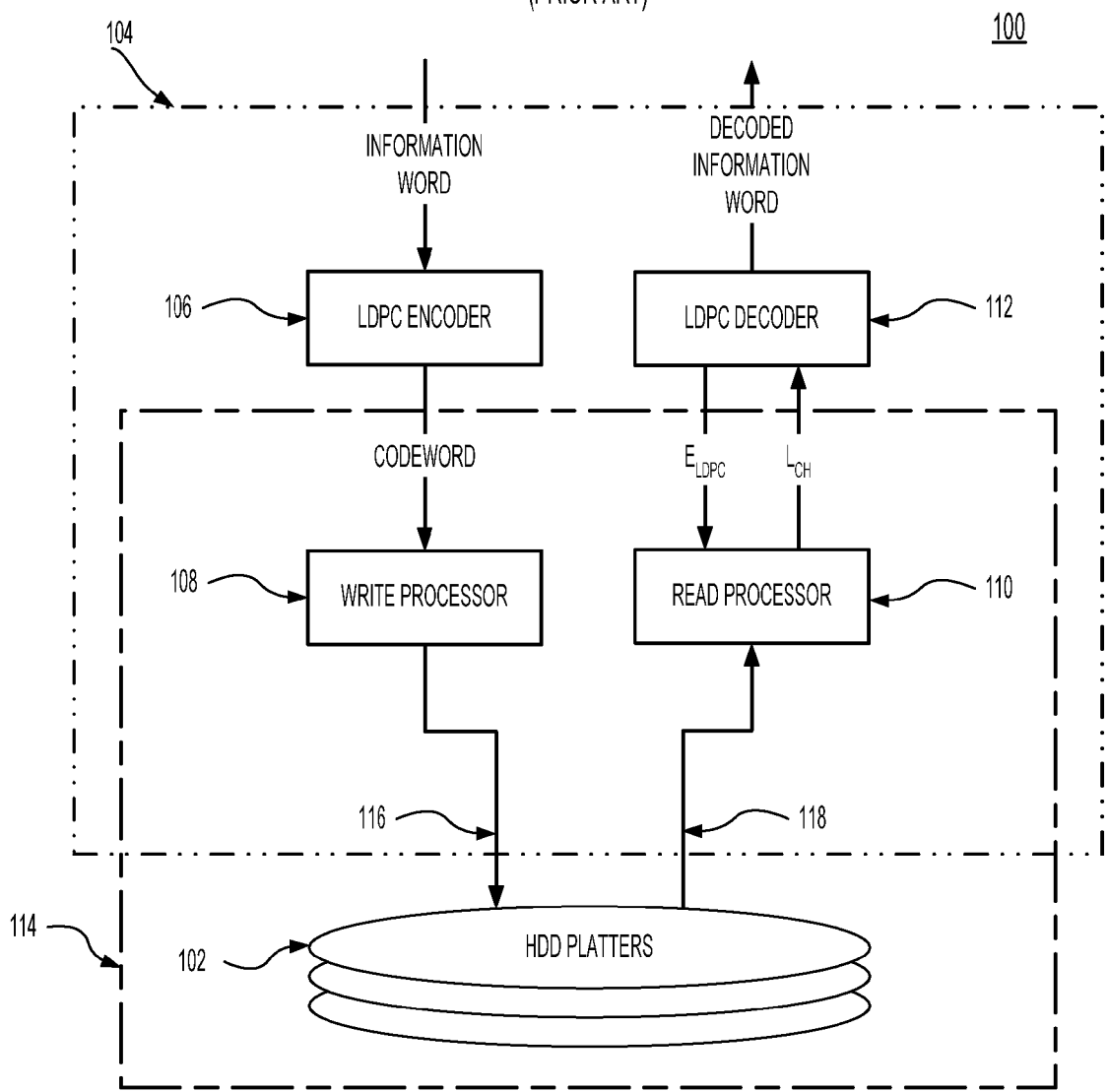
FIG. 1 is a block diagram of a portion of a typical hard disk (HD) drive 100 that utilizes LDPC coding.

FIG. 1 is a block diagram of a portion of a typical hard disk (HD) drive 100 that utilizes LDPC coding. HD drive 100 comprises platters 102 and read channel 104. Read channel 104 comprises LDPC encoder 106, write processor 108, read processor 110, and LDPC decoder 112. Path 114 is the noisy channel between LDPC encoder 106 and LDPC decoder 112.

Information words to be written to platters 102 are processed by LDPC encoder 106 to yield LDPC codewords. LDPC codewords are sent to write processor 108, which comprises a number of modules, e.g., a BPSK (binary phase-shift keying) encoder, a digital-to-analog converter, etc. Output 116 of write processor 108 is written to platters 102.

Signals 118 read from platters 102 are sent to read processor 110, which comprises a number of modules, e.g., a pre-amplifier, a continuous-time filter, a fixed-impulse response filter, a detector, an analog-to-digital converter, etc. Read processor 110 outputs log-likelihood ratio (LLR) values $L_{ch}$ to LDPC decoder 106, which in turn outputs decoded information words. Additionally, LDPC decoder 106 sends $E_{LDPC}$ values back to read processor 110. $E_{LDPC}$ are defined by Equation 6 below, and represent intermediate calculated LLR values. Read processor 110 uses the $E_{LDPC}$ values to tune its performance, a process known as turbo-decoding.

LDPC Encoding

LDPC encoder 106 appends to the bits of an information word a number of parity bits specified by the LDPC code, to yield a codeword. The bits in an information word are known as variable bits, and the number of those variable bits is denoted K. The total number of bits in an LDPC codeword is denoted N. Thus, the number of parity bits is given by N−K. The rate of a particular LDPC code is K/N, i.e., the ratio of the information word length to the codeword length. Thus, an LDPC code which appends six parity bits to each three-bit information word to yield a nine-bit codeword has a rate of 1/3. In the case of a typical HD drive, the information word length K is 4096 bits (the length of a typical HD drive sector), and the number of parity bits is approximately 410 bits, for a codeword length of 4506 bits and a rate of 0.9.

Each parity bit in an LDPC codeword is associated with one or more other (variable or parity) bits in that codeword in a particular way as specified by the particular LDPC code, and the value assigned to a parity bit is set so as to satisfy the LDPC code. Typical LDPC codes specify that associated bits satisfy a parity check constraint, e.g., the sum of the associated bits is an even number, i.e., sum modulo 2=0.

The LDPC Code

A particular LDPC code is defined by a two-dimensional matrix of 1s and 0s known as the parity check matrix, or H matrix, or simply H. H is known, a priori, by both the LDPC encoder and decoder. H comprises N columns and N−K rows, i.e., a column for every bit of the codeword, and a row for every parity bit. Each 1 in H represents an association between the codeword bit of the column and the parity bit of the row. For example, a 1 at the third row, seventh column of H means that the third parity check bit is associated with the seventh bit of the codeword. The modulo 2 sum of the value of a check bit and all variable bits associated with that check bit should be 0.

The number of 1s in a column of H is known as the weight $w_c$ of that column. Similarly, the number of 1s in a row of H is known as the weight $w_r$ of that row. The LDPC code defined by an H wherein all columns have the same $w_c$ and all rows have the same $w_r$ is known as a regular LDPC code. An LDPC code defined by an H where $w_c$ and/or $w_r$ are not the same across all columns and/or rows, respectively, is known as an irregular LDPC code.

A defining characteristic of typical LDPC codes is that H is "sparse," i.e., the elements of H are mostly 0s with few 1s. Research has shown that H matrices typically need $w_c \geq 3$ in order to perform well, and that irregular LDPC codes outperform regular LDPC codes.

Figure 2:
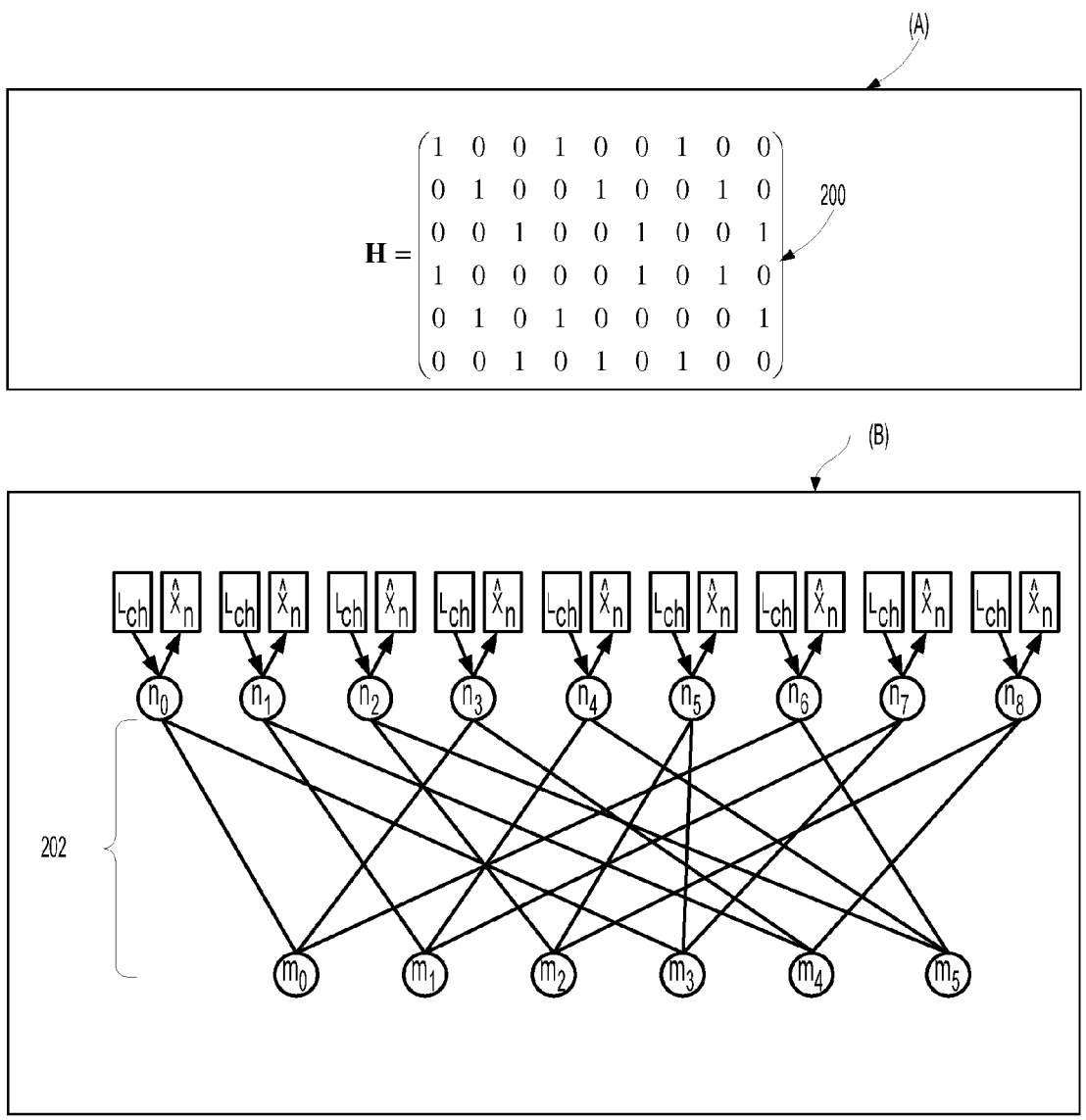
FIG. 2(A) depicts LDPC H matrix 200.
FIG. 2(B) is a Tanner graph of H matrix 200.

FIG. 2(A) depicts LDPC H matrix 200. H matrix 200 comprises N=9 columns and N−K=6 rows. Thus, H matrix 200 defines an LDPC code which accepts a three-bit information word, appends six parity bits, and outputs a nine-bit codeword. Thus, the rate of this particular LDPC code is 3/9 or 1/3. The LDPC code defined by H matrix 200 is regular, with a $w_c$ of two, and a $w_r$ of three.

Channel Output: Log-Likelihood Ratios

Returning to FIG. 1, the path 114 between LDPC encoder 106 and LDPC decoder 112 is a noisy channel, and, as such, decoder 112 does not receive a perfect copy of the codewords outputted by LDPC encoder 106. Instead, read processor 110 outputs one or more $L_{ch}$ values, where each $L_{ch}$ value corresponds to a bit in the channel input codeword.

Each $L_{ch}$ value is a log-likelihood ratio (LLR). An LLR is a data structure comprising a number of bits, where a single sign bit indicates the hard decision (i.e., read processor 110's best guess as to whether the original bit was a 1 or a 0), and the remaining magnitude bits indicate read processor 110's degree of confidence in that hard decision. More precisely, the LLR represents $$\log \frac{p_0}{p_1},$$

where $p_0$ is the probability that the sample represents a 0, and $p_1$ is the probability that the sample represents a 1.

For example, read processor 110 might output each $L_{ch}$ value as a five-bit data structure, where the most-significant bit is a sign bit which indicates the hard-decision value, and the 16 values of the four magnitude bits indicate the confidence of the hard decision. Thus, for example, in one typical scheme, an LLR value of binary 00000 would indicate a hard-decision value of 0 with least confidence, a value of binary 01111 would indicate a hard-decision value of 0 with maximum confidence, binary 10000 would be unused, binary 10001 would indicate a hard-decision value of 1 with least confidence, and a value of binary 11111 would indicate a hard-decision value of 1 with maximum confidence.

LDPC Decoding: Belief Propagation

Figure 3:
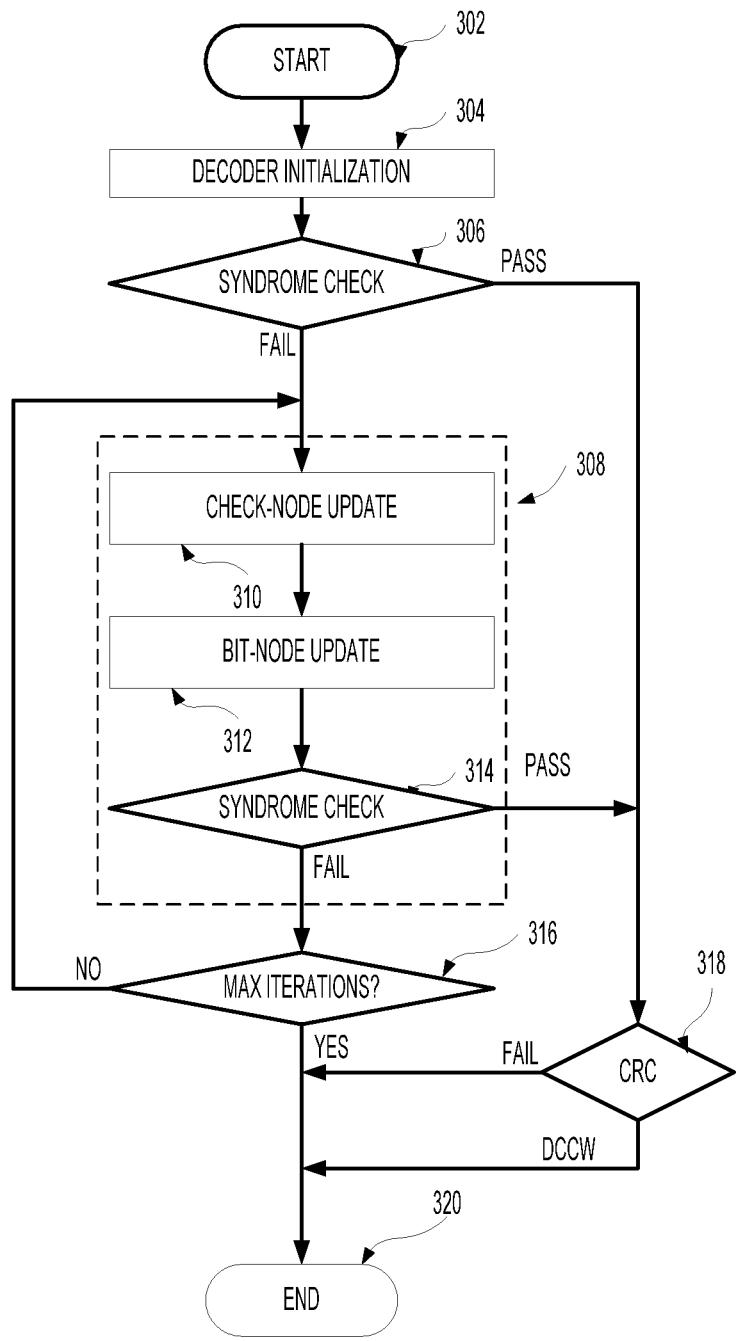
FIG. 3 is a flowchart of typical LDPC decoding method 300 used by decoder 112.

FIG. 3 is a flowchart of typical LDPC decoding method 300 used by decoder 112. LDPC decoder 112 receives N number of $L_{ch}$ values and outputs decoded information word. The heart of decoding method 300 is an iterative, two-phase message-passing algorithm called belief propagation. Belief propagation is best explained with the use of a visualization called a Tanner graph.

FIG. 2(B) is a Tanner graph of H matrix 200. In general, a Tanner graph comprises 1) a number of bit nodes n equal to the number of columns in H (and thus equal to the number of variable bits), 2) a number of check nodes m equal to the number of rows in H (and thus equal to number of parity bits), 3) lines, also known as edges, each of which connects a single bit node to a single check node, 4) for each bit node n, the original $L_{ch}$ value received from a receiver, and 5) for each bit node n, a calculated hard-decision output value $\hat{x}_n$. Tanner graph 2(B) comprises nine bit nodes $n_0$-$n_8$, six check nodes $m_0$-$m_5$, 18 edges 202 connecting bit nodes to check nodes, nine $L_{ch}$ values, and nine $\hat{x}_n$ values.

The edges in a Tanner graph represent the relationships between (i.e., variable) bit nodes n and check nodes m, i.e., edges represent is in H. For example, in FIG. 2(B), an edge 202 connects first bit node $n_0$ to fourth check node $m_3$, meaning that there is a 1 in the first column, fourth row of H matrix 200 in FIG. 2(A).

A Tanner graph is a bipartite graph, i.e., an edge can connect a bit node to only a check node, and cannot connect a bit node to another bit node, or a check node to another check node. The set of all bit nodes n connected by edges to a particular check node m is denoted N(m). The set of all check nodes m connected by edges to a particular bit node n is denoted M(n).

The index of a particular (bit or check) node is its ordinal sequence in the graph. The degree of a (bit or check) node is the number of edges connected to that node. Thus, the degree of bit node n in a Tanner graph is equal to the weight $w_c$ of column n in the corresponding H matrix, and the degree of check node m in a Tanner graph is equal to the weight $w_r$ of row m in the corresponding H matrix.

Returning to FIG. 3, processing starts at step 302 and proceeds to step 304, decoder initialization. Decoder initialization 304 comprises setting all edges (e.g., 202 of FIG. 2(B)) connected to bit node n to the corresponding $L_{ch}$ value associated with bit node n, and setting the $\hat{x}_n$ value of bit node n to the hard-decision value of bit node n's $L_{ch}$. Thus, for example, in FIG. 2(B), if the $L_{ch}$ value associated with bit node $n_0$ is +5, then, at step 304, the two edges 202 connecting bit node $n_0$ to check nodes $m_0$ and $m_3$ are set to +5, and bit node n's $\hat{x}_n$ value is set to 1. An alternative way of expressing the first part of this step is that bit node $n_0$ sends a message of +5 to each check node m in set M($n_0$). A message sent from a bit node n to a check node m is denoted $Q_{nm}$, where $Q_{nm}$ is in the form of an LLR. The state of a decoder which has just been initialized is referred to as state 0.

Step 304 then sends to syndrome check step 306 a vector $\hat{x}$ comprising N $\hat{x}_n$ values. Vector $\hat{x}$ is a codeword candidate. Syndrome check step 306 calculates syndrome vector z using the following Equation 1:

$$z = \hat{x} H^T \quad (1)$$

where $H^T$ is the transpose of the H matrix. If z is a 0 vector, then vector $\hat{x}$ has satisfied all the parity check constraints defined by H, i.e., $\hat{x}$ is a valid codeword. In that case, processing proceeds to cyclic-redundancy check (CRC) check 318.

If, instead, z is not a 0 vector, then vector $\hat{x}$ fails one or more of the parity check constraints, which are typically referred to as unsatisfied check nodes or USCs. The number of elements in syndrome vector z that are not 0 scalar values is the number b of USCs in vector $\hat{x}$. Further, the indices of the non-zero scalar elements of syndrome vector z are the indices of the USCs in vector $\hat{x}$.

If vector $\hat{x}$ fails syndrome check 306, then processing continues to the first of one or more decoding iterations 308. Decoding iteration 308 comprises three steps: 1) a belief-propagation check-node update step 310, 2) a belief-propagation bit-node update step 312, and 3) a syndrome check step 314, which is identical to step 306.

In belief-propagation check-node update step 310, each check node m uses the $Q_{nm}$ messages received from all bit nodes n in set N(m) to calculate messages, denoted $R_{mn}$, according to the following Equations 2, 3, and 4:

$$R_{mn}^{(i)} = \delta_{mn}^{(i)} \max(\kappa_{mn}^{(i)} - \beta, 0) \quad (2)$$

$$\kappa_{mn}^{(i)} = |R_{mn}^{(i)}| = \min_{n' \in N(m) \setminus n} |Q_{n'm}^{(i-1)}| \quad (3)$$

$$\delta_{mn}^{(i)} = \left( \prod_{n' \in N(m) \setminus n} \operatorname{sgn}(Q_{n'm}^{(i-1)}) \right) \quad (4)$$

where i is the decoding iteration, N(m)\n is set N(m) excluding bit node n, and $\beta$ is a positive constant, the value of which depends on the code parameters. The calculated $R_{mn}$ messages are then sent back along those same edges to all bit nodes n in set N(m). Like $Q_{nm}$ messages, $R_{mn}$ messages are LLRs.

Next, in belief-propagation bit-node update step 312, each bit node n calculates $Q_{nm}$ messages according to the following Equation 5:

$$Q_{nm}^{(i)} = L_n^{(0)} + \sum_{m' \in M(n) \setminus m} R_{m'n}^{(i)} \quad (5)$$

where $L_n^{(0)}$ is the $L_{ch}$ value for bit node n, and M(n) \ m is set M(n) excluding check node m. Bit node n then sends the calculated $Q_{nm}$ messages to all check nodes m in set M(n).

Also during bit-node update step 312, each bit node n updates its $\hat{x}_n$ value according to the following Equations 6 and 7:

$$E_n^{(i)} = \sum_{m' \in M(n)} R_{mn}^{(i)} \quad (6)$$

$$P_n = L_n^{(0)} + E_n^{(i)} \quad (7)$$

If $P_n \geq 0$, then $\hat{x}_n = 0$, and if $P_n < 0$, then $\hat{x}_n = 1$. The values generated by Equation 6 are also referred to as E-values or $E_{LDPC}$ values. Typically, $E_{LDPC}$ values are sent back to the read processor (e.g., read processor 110 of FIG. 1) as part of a tuning process known as turbo-decoding. The values generated by Equation 7 are referred to as P-values. The specific belief-propagation algorithm represented by Equations 2-7 is known as the min-sum algorithm.

Note that $\hat{x}_n$ is updated during each decoding iteration 308 and finally outputted by decoding process 300. The original LLR values $L_{ch}$ remain unchanged during decoding process 300. In other words, during each decoding iteration 308, each bit node n casts its vote as to the proper value of all the other bit nodes n to which it is associated via a check node m. For example, in FIG. 2(B), bit node $n_0$ is associated with check nodes $m_0$ and $m_3$. Therefore, $n_0$ will cast its vote as to the proper values of the bit nodes associated with check nodes $m_0$ and $m_3$, i.e., $n_3$, $n_5$, $n_6$, and $n_7$. The greater the magnitude value of bit node n's $L_{ch}$ value (i.e., the greater the confidence), the more bit node n's vote counts. The net effect of this vote-casting is that the $\hat{x}_n$ value of a bit node with a low $L_{ch}$ magnitude value (i.e., confidence) will change and conform to the beliefs of the high-confidence bit nodes with which that bit node is associated. In other word, if a bit node's $L_{ch}$ value contains an erroneous hard-decision value and low magnitude, then the combined votes of the other bit nodes will tend, after one or more iterations, to correct that erroneous hard-decision value.

Bit-node update step 312 sends to syndrome check step 314 a vector $\hat{x}$ constructed out of the current $\hat{x}_n$ values of the decoder. The syndrome check of step 314 is identical to the syndrome check of step 306 discussed above. If vector $\hat{x}$ passes syndrome check 314, then vector $\hat{x}$ is sent to CRC step 318

LDPC Decoding: Cyclic Redundancy Check and Mis-Satisfied Check Nodes

Passing syndrome check 306 or 314 means only that vector $\hat{x}$ is a valid codeword, but not necessarily the decoded correct codeword (DCCW). It is possible for an LDPC decoder to generate a valid codeword which is not the DCCW. In that case, there are no USCs in vector $\hat{x}$, but there are mis-satisfied check nodes (MSCs). Thus, to ensure that valid vector $\hat{x}$ is the DCCW, process 300 passes vector $\hat{x}$ to cyclic redundancy check (CRC) 318. A CRC check is a checksum operation which can detect alteration of data during transmission or storage.

If vector $\hat{x}$ passes the CRC check, then vector $\hat{x}$ is the DCCW, and process 300 sets global variable DCCW to true, outputs vector x, and terminates at step 320. Otherwise, vector $\hat{x}$ is not the DCCW, and process 300 sets global variable DCCW to false, outputs vector x, and terminates at step 320. Global variable DCCW informs other decoding processes (e.g., TS-ROM list decoding process 1206 of FIG. 12, discussed below) whether or not the DCCW has been generated.

Returning to step 314, if vector $\hat{x}$ fails the syndrome check, then vector $\hat{x}$ still contains one or more USCs. The typical method for resolving USCs is to perform another decoding iteration 308. However, there might exist one or more USCs in a particular vector $\hat{x}$ which will never be satisfied in a reasonable amount of time. Thus, LDPC decoders are typically limited in how many decoding iterations they can perform on a particular vector $\hat{x}$. Typical values for the maximum number of iterations range from 50 to 200.

In FIG. 3, step 316 determines whether the maximum number of iterations has been reached. If not, then another decoding iteration 308 is performed. If, instead, the maximum number of iterations has been reached, then decoder process 300 has failed, i.e., the decoder is a "failed decoder." In that case, process 300 sets global variable DCCW to false, outputs vector $\hat{x}$, and terminates at step 320.

If vector $\hat{x}$ of a failed decoder contains a small number (e.g., less than 16) of USCs, then vector $\hat{x}$ is referred to as a near codeword (NCW). If vector $\hat{x}$ of a failed decoder contains a large number (e.g., greater than 15) of USCs, then vector $\hat{x}$ is referred to as an invalid codeword (ICW).

Two typical methods for handling a failed decoding process are 1) to request a re-send of the corresponding data or 2) to pass vector $\hat{x}$ to one or more post-processing (PP) methods. Typically, the number b of USCs in vector $\hat{x}$ dictates which of these two methods will be used. A large b (e.g., greater than 16) is typically handled by a re-send or other post-processing method, while small b values are handled by error-floor mitigation post-processing methods.

BER, SNR, and Error Floors

The bit-error rate (BER) of an LDPC decoder is a ratio which expresses how many erroneously decoded bits will be generated for x number of bits processed. Thus, for example, a decoder with a BER of $10^{-9}$ will, on average, generate one erroneous bit for every billion bits processed. The smaller the BER, the better the decoder. The BER of an LDPC decoder increases (worsens) when the decoder fails, i.e., terminates without converging on the decoded correct codeword DCCW.

The BER of an LDPC decoder is strongly influenced by the signal-to-noise ratio (SNR) of the decoder's input signal. A graph of BER as a function of SNR typically comprises two distinct regions: an initial "waterfall" region where the BER improves (decreases) rapidly given a unit increase in SNR, and a subsequent "error floor" region where unit increases in SNR yield only modest improvements in BER. Thus, achieving significant BER improvements in the error floor region requires methods other than SNR increase.

One method for improving the error-floor characteristics of an LDPC decoding is to increase the codeword length. However, increasing codeword length also increases the memory and other computing resources required for LDPC decoding. Thus, if such resources are strictly limited, as is typically the case with the read-channel devices on HD drives, then other methods must be found to yield the necessary error-floor improvement.

Another scarce resource is processing cycles. Typically, to achieve a specified throughput, an HD drive budgets a fixed number of read-channel processing cycles for decoding a codeword. Methods which exceed that budget (i.e., off-the-fly methods) decrease the throughput. More desirable are on-the-fly methods which recover the DCCW within the clock-cycle allotment and thus do not decrease the throughput.

Trapping Sets and Dominant Trapping Sets

An (a, b) trapping set is a set of b USCs which a decoder cannot satisfy within the maximum number of iterations, and the a erroneous bit nodes (EBNs) associated with those USCs. The majority of trapping sets comprise fewer than five USCs and fewer than ten EBNs. Trapping sets have a significant impact on the error-floor characteristics of an LDPC decoder, i.e., when an LDPC decoder fails to converge on the DCCW, it is often because of a trapping set.

One way to improve the error-floor characteristics of an LDPC decoder is to (i) examine the USCs in the $\hat{x}$ vector of a failed decoder and identify trapping sets (if any), (ii) identify the EBNs associated with those USCs, (iii) flip one or more EBNs associated with those trapping sets, and (iv) re-start the decoder. In one possible implementation, if an LDPC decoder has just been initialized, i.e., the decoder is in state 0, then flipping an EBN comprises (i) inverting the hard-decision value of that EBN's $L_{ch}$ value, i.e., 1 becomes 0, and vice versa, and (ii) setting the magnitude bits, i.e., the confidence, of that same $L_{ch}$ value to maximum, e.g., all ones. If the decoder is in some state other than state 0, then flipping an EBN comprises (i) determining the hard-decision value of the EBN's P-value (defined by Equation 7 above), (ii) setting the hard-decision values of that EBN's $L_{ch}$ value, P-value, and all associated $Q_{nm}$ LLRs to the opposite of the hard-decision value of step (i), and (iii) setting the magnitude bits of that EBN's $L_{ch}$ value, P-value, and all associated $Q_{nm}$ LLRs to maximum. Often, flipping one or two EBNs will "break" the trapping set, and the re-started decoder will converge on the DCCW.

Different trapping sets, when broken, will yield different improvements in error-floor characteristics. Dominant trapping sets (DTSs) refer to the minimal set of trapping sets, the breaking of which yields a specified improvement in BER/error-floor characteristics. For example, DTS-1 refers to the minimal set of trapping sets which will yield a single order of magnitude improvement in BER, e.g., from $10^{-9}$ to $10^{-10}$, while DTS-3 would yield three orders of magnitude improvement in BER, e.g., $10^{-10}$ to $10^{-13}$.

List Decoding of Near Codewords

List decoding is one post-processing method for detecting and breaking trapping sets. In list decoding, an observed trapping set in vector $\hat{x}$ is matched against a list or lists of known trapping sets. A trapping-set list typically contains the indices of all the USCs in each trapping set in the list and the indices of one or more EBNs associated with those USCs. If a trapping set is found in the list which matches the observed trapping set, then the EBN index value(s) are retrieved from the list. Then, those bit nodes are flipped, and the decoding process 300 of FIG. 3 is restarted.

Trapping-Set Simulation

Figure 4:
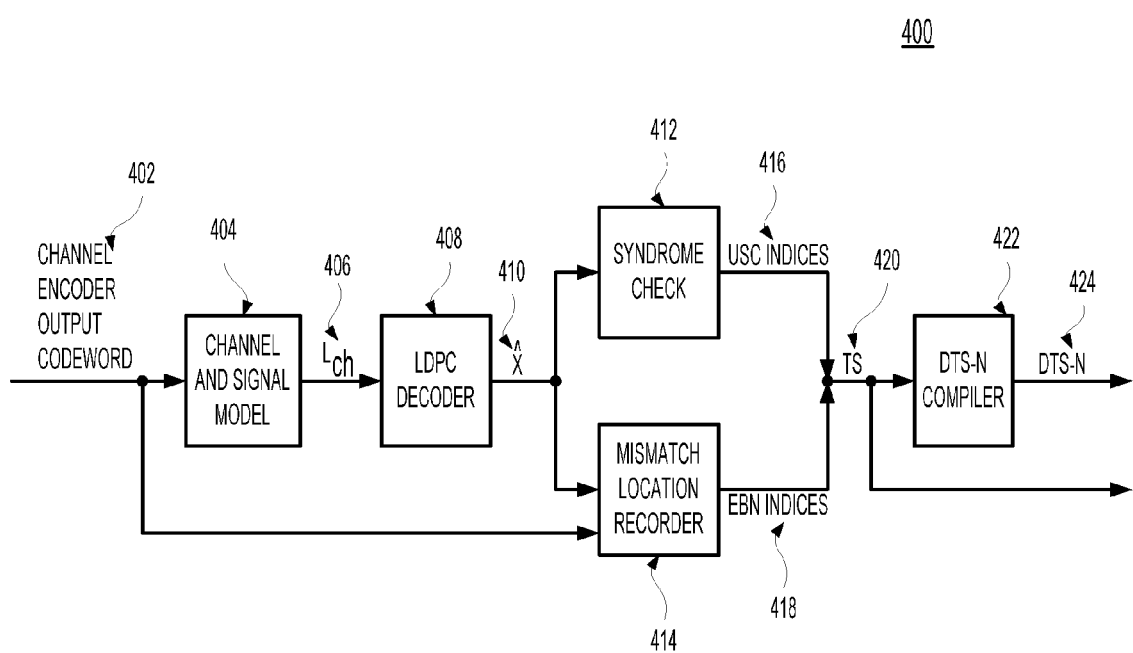
FIG. 4 is a block diagram of an off-line trapping-set (TS) simulation tool 400 for identifying trapping sets and recording various information about those trapping sets.

The trapping-set list required for list decoding is typically generated off line using software and hardware simulation tools. FIG. 4 is a block diagram of an off-line trapping-set (TS) simulation tool 400 for identifying trapping sets and recording various information about those trapping sets. Tool 400 might be implemented, for example, in a field-programmable gate array (FPGA). LDPC correct codeword (CCW) 402 is sent to channel and signal model 404, which emulates the behavior of noisy channel 114 in FIG. 1. Channel and signal model 404 outputs $L_{ch}$ values 406 to LDPC decoder 408. If LDPC decoder 408 generates a near codeword (NCW) 410, then NCW 410 is sent to syndrome check module 412 and mismatch location recorder 414. Syndrome check 412 outputs the indices 416 of all USCs in NCW 410. Mismatch location recorder 414 compares NCW 410 to CCW 402 and outputs the indices 418 of all EBNs in NCW 410. USC indices 416 plus EBN indices 418 constitute trapping-set (TS) information 420.

For a given LDPC implementation, all possible trapping sets might number in the millions. However, achieving a significant (i.e., an order of magnitude or more) improvement in the error floor of that implementation typically requires only a subset of all possible trapping sets, i.e., the dominant trapping sets (DTSs). Thus, off-line TS simulation tool 400 includes DTS-N compiler 422, which takes as its input TS information 420 and generates DTS-N information 424.

DTS-N compiler 422 uses a three-step process: collection, ranking, and evaluation. The trapping set collection method utilizes deterministic noise impulses based on the structure of the code graph to detect trapping sets. The collected trapping sets are then ranked by distance-to-error boundary (DEB) values, where trapping sets with low DEB values contribute more to the error floor. Importance sampling is then used to evaluate the trapping sets and confirm the predicted rankings.

In practice, such FPGA-based offline simulations can take up to a year to perform. For example, to identify the trapping sets that will yield a BER of $10^{-15}$ for a 4 Gb/s HD drive requires running an offline-simulation tool (e.g., tool 400 of FIG. 4) for approximately 289 days. Typically, this time constraint is not a problem, as there is often a one- to two-year delay between the final design of an HD drive read channel and the mass-fabrication of chips.

Trapping Set Read-Only Memory (TS-ROM)

Thus, using an off-line TS simulation tool like tool 400 of FIG. 4, it is possible a priori to identify one or more trapping sets or dominant trapping sets that will yield an improvement in the error-floor characteristics for a particular LDPC implementation. One way to implement list decoding in a run-time environment is to store offline-generated trapping-set information 420 of FIG. 4 in a trapping-set read-only memory (TS-ROM) and couple that TS-ROM with a list decoder program. The TS-ROM list decoder program compares the USCs observed in $\hat{x}$ to trapping sets stored in TS-ROM. If a match is found, then the TS-ROM list decoder program flips the appropriate bit-node values in the LDPC decoder and re-starts the decoder.

Typically, TS-ROM information is stored randomly in a singly- or doubly-linked list, where the list is searched using a brute-force sequential search. Typically, each (a, b) trapping set occupies (2+a+b) records in the TS-ROM list. Thus, for a (4,4) trapping-set profile (i.e., four USCs and four EBNs), there would be ten records: one record indicating that there are four USCs, followed by four individual USC records, then a record indicating that there are four EBNs, followed by four individual EBN records. The typical TS-ROM list implementation stores approximately 100 trapping sets, and does not store any information about mis-satisfied check nodes.

For such a TS-ROM implementation to be economically practical, a single TS-ROM must be able to achieve the required error-floor improvement in a large number of implementations. However, trapping sets vary from implementation to implementation, even when the same LDPC code is implemented. For example, even if the LDPC code used on two HD drives were the same, the trapping sets associated with the HD drives may differ. Specifically, research has shown that trapping sets are influenced by an HD drive's jitter profile, inter-symbol interference characteristics, and pulse-shaping scheme. These factors can vary not only between HD drives of different manufacturers, but also between different HD drive models from the same manufacturer and even variations between different production runs of the same model. Thus, trapping sets can vary even between two identical-model hard drives. It is impractical to simulate the LDPC trapping sets of so many different HD drives. Yet, a TS-ROM loaded with only those trapping sets common to a large class of HD drives might not yield the required level of error-floor improvement when paired with a particular HD drive.

One method for improving the performance of TS-ROM is to supplement the information generated by an FPGA-based offline-simulation tool (e.g., tool 400 of FIG. 4) with results obtained from test models of the fabricated device. Typically, once a circuit design has been finalized, a limited number of test models of that design will be fabricated and distributed for testing before mass-production commences. While it might take a year to determine the trapping sets which will yield a BER of $10^{-15}$ for a particular HD drive implementation, it only takes a day to determine the trapping sets which will yield a BER of $10^{-12}$. Thus, the test models are run in LDPC test mode for a limited period of time, and any discovered trapping sets are stored. Any discovered trapping sets not already in TS-ROM are added to TS-ROM. By using the actual device that will be distributed to consumers, this method captures trapping sets that may have eluded an FPGA-based offline-simulation tool (e.g., tool 400 of FIG. 4).

Trapping Set Random-Access Memory (TS-RAM)

One run-time alternative to the static trapping-set list of TS-ROM is to store trapping-set information in a trapping-set random-access memory (TS-RAM) and turn the off-line trapping-set simulation tool 400 of FIG. 4 into a run-time trapping-set collection and analysis tool running on the actual, individual device (e.g., an HD drive). Instead of receiving initial values from a channel and signal model (e.g., model 404 of FIG. 4), the run-time tool would process the actual signal of that particular device. The run-time tool would include list-decoder functionality; i.e., it would attempt to match observed USCs to stored trapping-set information in TS-RAM, and, if a match were found, use the stored information to change decoder bit-node values and restart the decoder. If a match were not found, then the run-time tool would analyze the observed trapping set, i.e., identify the EBNs associated with the USCs, and determine if the observed trapping set met threshold requirements for storage in TS-RAM (e.g., membership in a DTS-N).

Theoretically, the TS-RAM tool described above could adapt to the trapping-set profile of any implementation. The reality is that the trapping set/dominant trapping set simulation performed by off-line simulation tool 400 of FIG. 4 is computationally complex. In particular, constructing dominant trapping sets out of possibly millions of trapping sets is especially complex. This complexity makes the TS-RAM tool described above unsuitable for most HD drives. Typically, HD drives output data at high rates (e.g., 4 gigabits per second) and demand very low BER/error-floor rates (e.g., $10^{-13}$ to $10^{-15}$), but offer only modest computing resources in their firmware.

Furthermore, the TS-RAM tool, like the off-line simulation tool 400 of FIG. 4, requires the correct codeword (CCW) to generate EBN indices. CCWs are readily available in the off-line simulation environment, but not in the run-time environment.

According to certain embodiments of the present invention, methods are performed for the organization of stored trapping-set profiles in ROM. Trapping-set profiles are ranked by dominance, i.e., by their impact on the error-floor characteristics of an LDPC decoder. More-dominant trapping-set profiles contain information about both unsatisfied check nodes (USCs) and mis-satisfied check nodes (MSCs), while less-dominant trapping-set profiles contain only information about USCs. Trapping-set profile information is then organized into a number of linked, hierarchical data tables which allow for the rapid location and retrieval of most-dominant matching trapping-set profiles using a pointer-chase search.

According to certain embodiments of the present invention, efficient run-time methods are performed for the collection and identification of dominant trapping-sets in RAM. Newly-discovered trapping sets are stored in RAM, if possible, and then sorted or ranked on any one or more of the following factors: number of times RAM has been searched since a trapping set was lasted matched; total number of times a trapping set has been matched since it was added to RAM; number of unsatisfied check nodes; and number of erroneous bit nodes. Low-ranked trapping-set profiles are deleted from RAM to make space for newly-discovered trapping-set profiles. Thus, in addition to or instead of using a high-computational-complexity offline method for the a priori identification of dominant trapping sets, such as that used in DTS-N compiler 422 of FIG. 4, these embodiments of the present invention perform low-computational-complexity a posteriori methods wherein as many newly-discovered trapping sets are stored as possible, and non-dominant trapping-set profiles winnowed out by periodic ranking and deletion.

Embodiments of the present invention typically are on-the-fly methods, i.e., they are able to recover the DCCW within the clock-cycles budgeted for LDPC decoding, and thus do not negatively impact system throughput.

Figure 5:
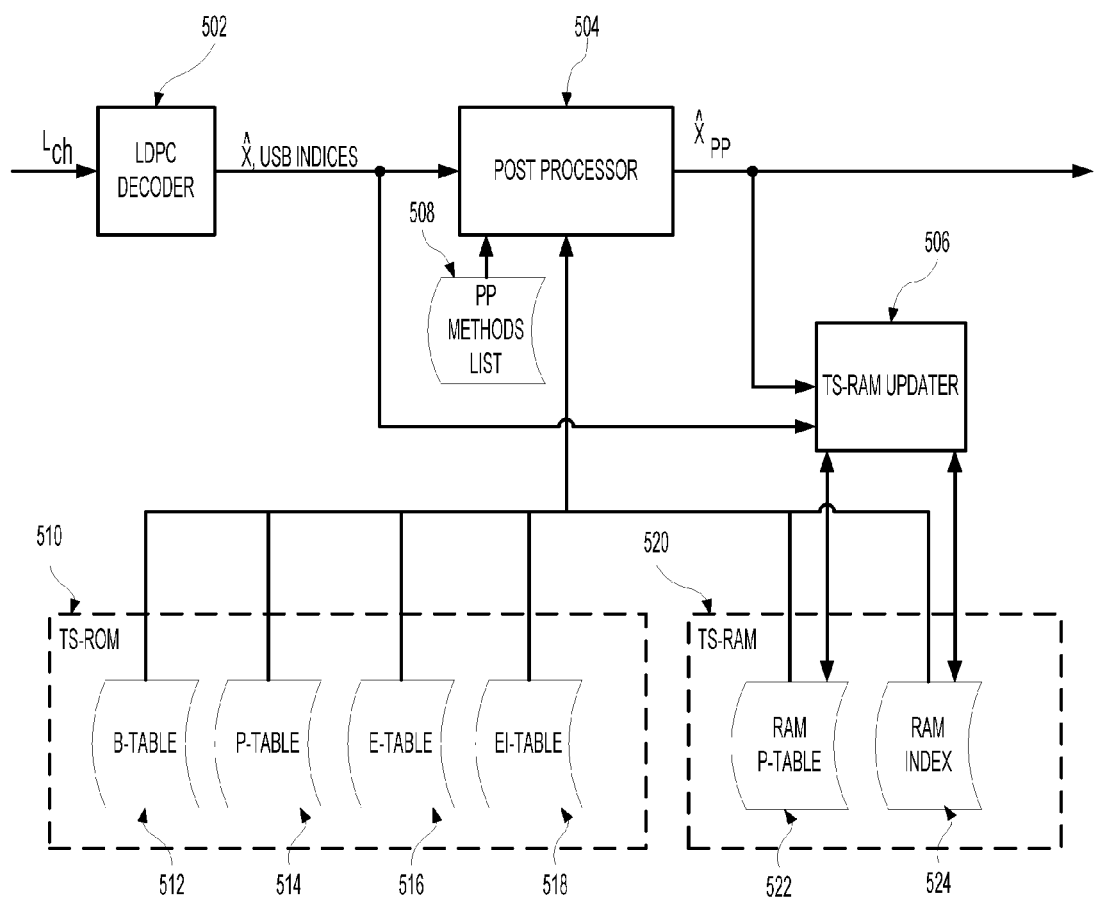
FIG. 5 is a block diagram of an LDPC decoding system 500 according to one embodiment of the present invention.

FIG. 5 is a block diagram of an LDPC decoding system 500 according to one embodiment of the present invention. In an HD drive of the present invention analogous to prior-art HD drive 100 of FIG. 1, LDPC decoding system 500 of FIG. 5 would be implemented as part of an LDPC decoder analogous to LDPC decoder 112 of FIG. 1. To that extent, the input $L_{ch}$ values of FIG. 5 are analogous to the decoder input $L_{ch}$ values of FIG. 1, and the output $\hat{x}_{pp}$ vector of FIG. 5 is analogous to the decoded information word of FIG. 1.

LDPC decoder 502 receives $L_{ch}$ values, performs LDPC decoding process 300 of FIG. 3, and outputs vector $\hat{x}$ to post-processor 504 and TS-RAM updater 506. Post-processor 504 is connected to post-processing (PP) methods list 508, which is a memory that contains one or more executable programs representing post-processing methods, e.g., TS-ROM list decoding, TS-RAM list decoding, etc. If post-processor 504 needs to perform a particular PP method, post-processor 504 reads the executable program from PP methods list 508 and runs that program. Post-processor 504 might perform any number of these PP methods in parallel or serially. Post-processor 504 outputs vector $\hat{x}_{pp}$, which, in addition to being output from LDPC decoding system 500, is also sent to TS-RAM updater 506.

The Data Tables

During execution, a particular PP method might need to access data structures separate from the PP method executable program code. In particular, TS-ROM and TS-RAM list-decoding methods access one or more lists of trapping-set information stored in TS-ROM 510 and TS-RAM 520, respectively.

In the exemplary embodiment of FIG. 5, TS-ROM 510 comprises four tables: B-Table 512, P-Table 514, E-Table 516, and EI-Table 518. TS-RAM 520 comprises two tables, RAM P-Table 522 and RAM Index 524. A table is a two-dimensional matrix of digital data organized into one or more equally sized rows (records) and one or more equally sized columns (fields). The records of a table are ordinarily numbered from top to bottom beginning with zero. This number is the record number.

P-Tables 514 and 522 contain information regarding USCs and their related EBNs. B-Table 512 contains pointer information for ROM P-Table 514. EI-Table 518 contains information regarding MSCs, and E-Table 516 contains pointer information for EI-Table 518. RAM Index Table 524 contains pointer information for RAM B-Table 522.

Figure 6:
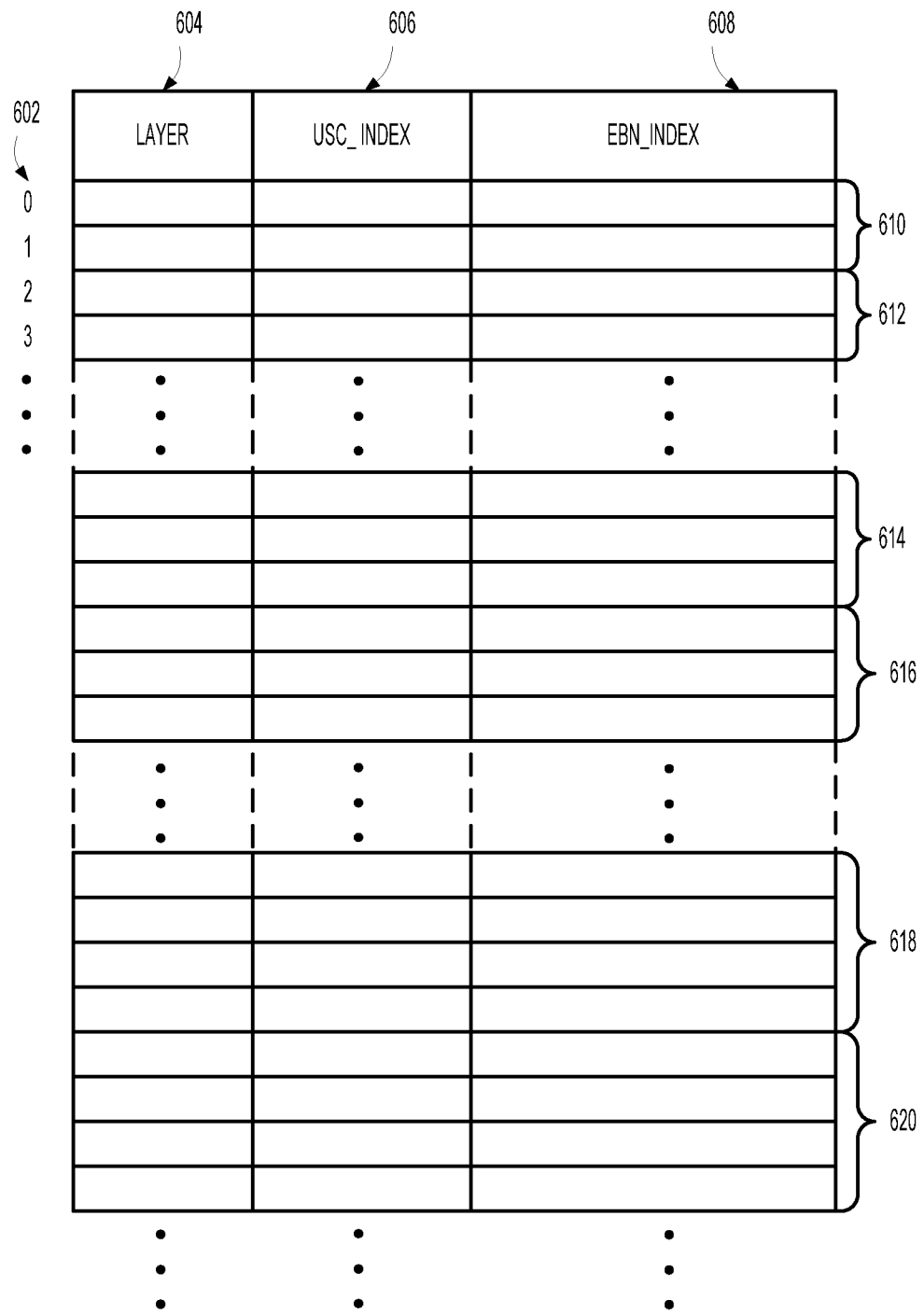
FIG. 6 is an exemplary layout of ROM P-Table 514 of FIG. 5.

FIG. 6 is an exemplary layout of ROM P-Table 514 of FIG. 5. ROM P-Table 514 contains trapping-set profile information, i.e., USC and EBN indices. ROM P-Table 514 comprises a number of records (rows), one for each USC of each stored trapping set. Record number 602 is the ordinal location of a record in P-Table 514, beginning with 0.

Each record in ROM P-Table 514 comprises three fields: LAYER 604, USC_INDEX 606, and EBN_INDEX 608. Some LDPC decoders are configured to execute a set of update operations in parallel, otherwise known as a layer. LAYER 604 indicates the number of the decoding layer that contained the USC. USC_INDEX 606 contains the index of the USC. EBN_INDEX 608 contains the indices of one or two EBNs associated with the USC.

ROM P-Table 514 is sorted first on b (i.e., the number of USCs in $\hat{x}$), e.g., all trapping sets with b=2 come first, followed by all b=3 trapping sets, etc. Thus, there will be two records for each trapping set (e.g., 610, 612) in the b=2 range, eventually followed by three-record sets for trapping sets with b=3 (e.g., 614, 616), four-record sets for trapping sets with b=4 (618, 620), and so forth.

Within each b range, trapping sets are sorted by dominance, i.e., the effect that the trapping set has on error-floor characteristics. Those trapping sets which have a greater effect on error-floor characteristics occur at the beginning of the b range, and those which have a lesser effect occur near the end. The records for a particular trapping set are then sorted by USC_INDEX 606.

Figure 7:
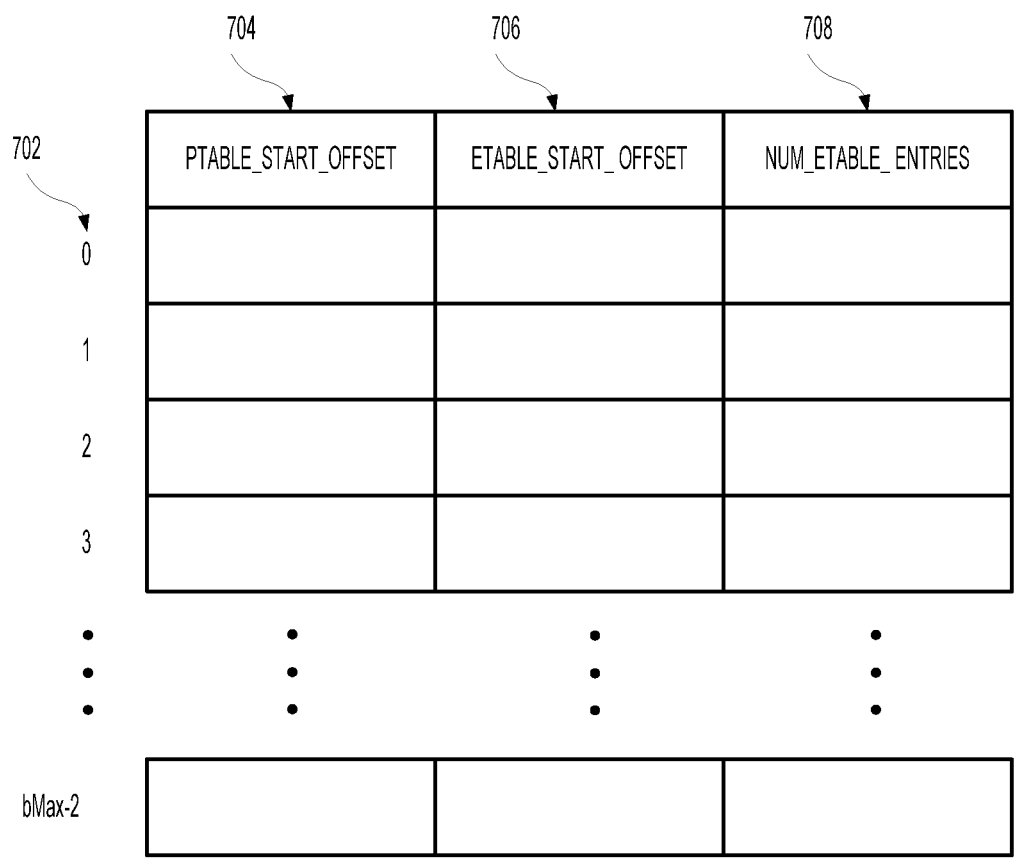
FIG. 7 is an exemplary layout of B-Table 512 of FIG. 5.

FIG. 7 is an exemplary layout of B-Table 512 of FIG. 5. B-Table 512 contains, for each b value in ROM P-Table 514, pointers to the first occurrences of that b value in ROM P-Table 514 and in E-Table 516, and the number of records in E-Table 516 for that b value. Thus, there is a single record in B-Table 512 for each b value, where the b value is indicated by record number 702. However, records numbers 702 start with 0, while b values typically start at two or higher. Thus, in this exemplary embodiment of the present invention, an offset is added to record number 702 to yield the corresponding b value. For example, if only trapping sets with b≧2 are stored, then an offset of 2 would be added to each record number to arrive at the corresponding b value.

Field PTABLE_START_OFFSET 704 contains the location of the first occurrence of a particular b value in ROM P-Table 514. Field ETABLE_START_OFFSET 706 contains the location of the first occurrence of a particular b value in E-Table 516. Field NUM_ETABLE_ENTRIES 708 contains the number of records in E-Table 516 for this particular b value.

Figure 8:
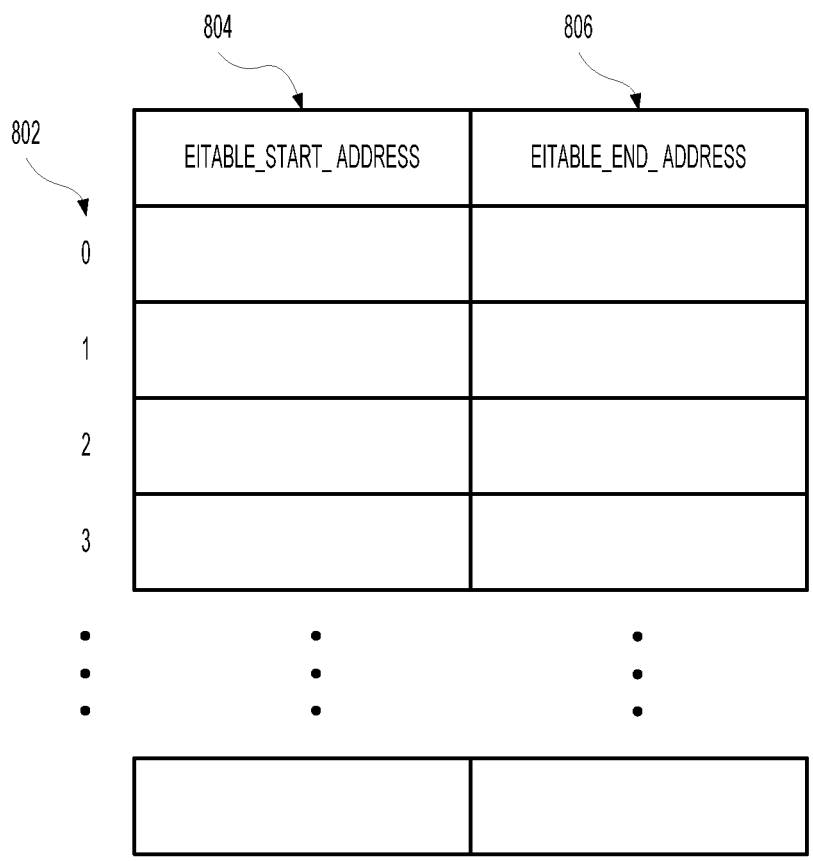
FIG. 8 is an exemplary layout of E-Table 516 of FIG. 5.

FIG. 8 is an exemplary layout of E-Table 516 of FIG. 5. E-Table 516 contains pointers to MSC records in EI-Table 518. Each record in E-Table 516 has a record number 802, an EITABLE_START_ADDRESS field 804, and an EITABLE_END_ADDRESS field 806. EITABLE_START_ADDRESS field 04 contains a pointer to the first occurrence of the corresponding data in EI-Table 518, and EITABLE_END_ADDRESS field 806 contains a pointer to the last occurrence of the corresponding data in EI-Table 518.

Figure 9:
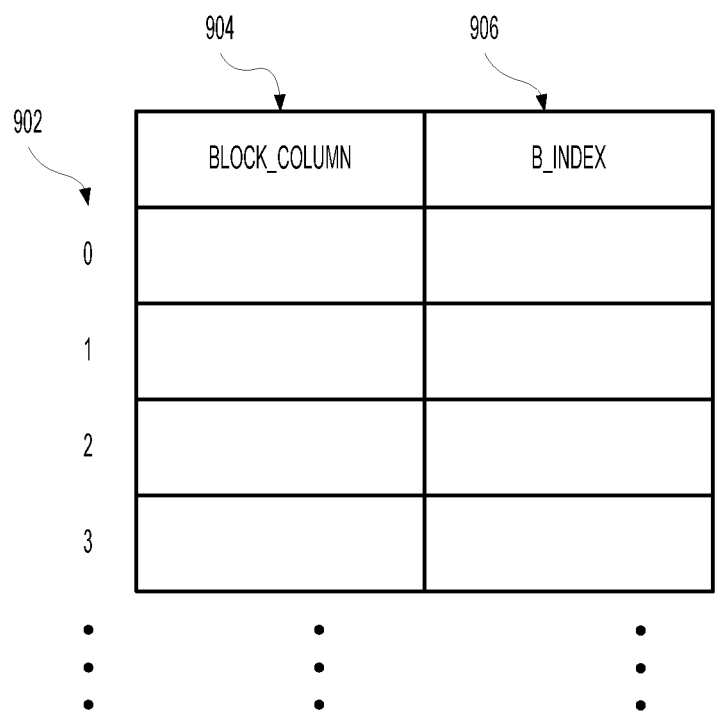
FIG. 9 is an exemplary layout of EI-Table 518 of FIG. 5.

FIG. 9 is an exemplary layout of EI-Table 518 of FIG. 5. EI-Table 518 stores the indices of EBNs associated with MSCs. Each record in EI-Table 518 has a record number 902 and contains two fields: BLOCK_COLUMN field 904 and B_INDEX field 906. BLOCK_COLUMN field 904 indicates the block column where the EBN is located, and B_INDEX field 906 is the index of the EBN.

Figure 10:
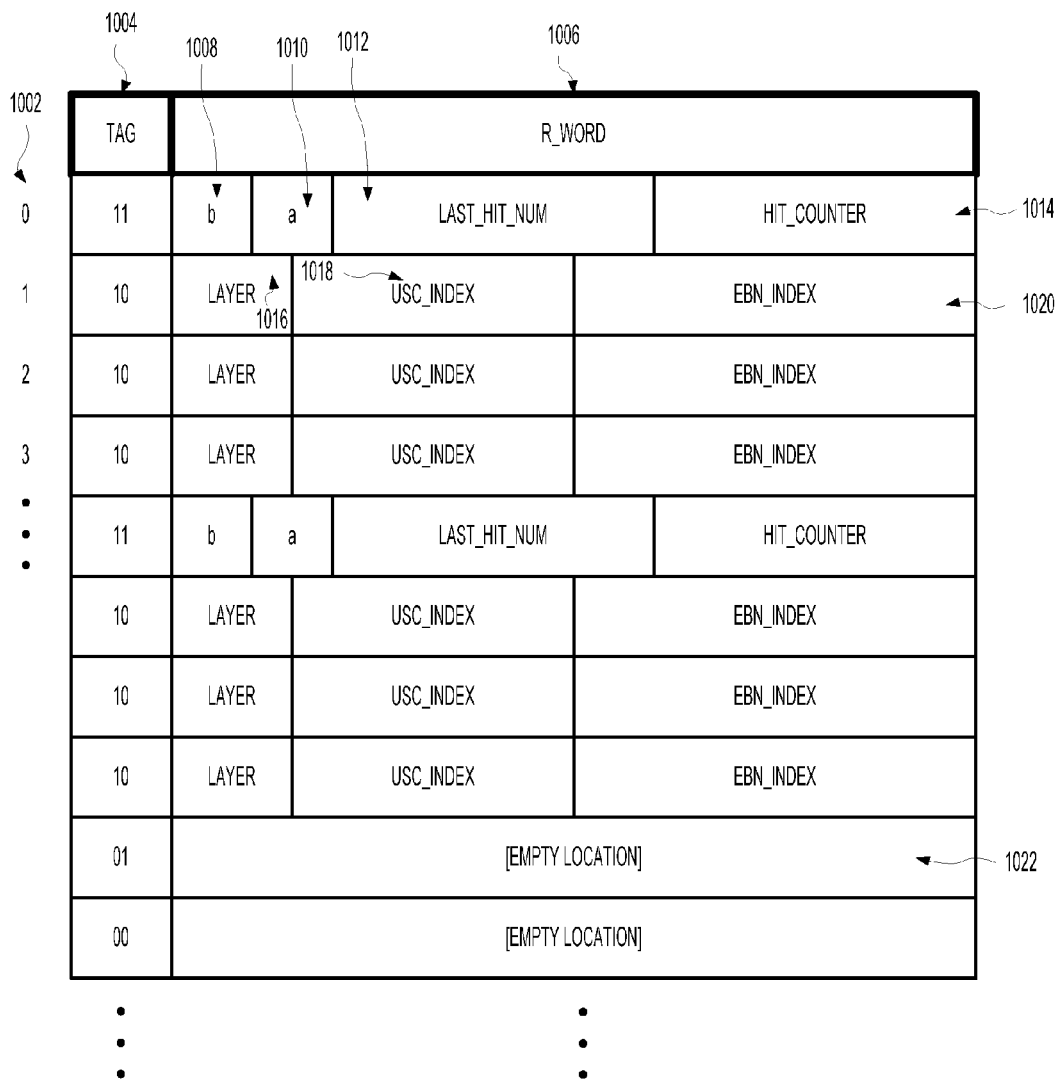
FIG. 10 is an exemplary layout of RAM P-Table 522 of FIG. 5.

FIG. 10 is an exemplary layout of RAM P-Table 522 of FIG. 5. RAM P-Table 522 stores the profiles of newly-identified trapping sets that are not found in ROM P-Table 514. Each row (i.e., record) in RAM P-Table 522 has a record number 1002 and comprises two fields: two-bit TAG field 1004 and R_WORD field 1006. The four possible values of TAG field 1004 indicate the record type and the structure of data within R_WORD field 1006. If TAG field 1004 has a value of 11, then the record is a primary record that contains information pertaining to an entire trapping set. If TAG field 1004 has a value of 10, then the record is a secondary record and contains information pertaining to a particular USC within a trapping-set profile. If TAG field 1004 has a value of 00 or 01, then the R_WORD field 1006 is empty, i.e., this record is available to store the profile information for newly-identified trapping sets. A trapping-set profile typically comprises a single primary record followed by b secondary records.

If the record is a primary record, then R_WORD field 1006 contains four sub-fields: (i) b-value subfield 1008, (ii) a-value subfield 1010, which records the number of trapping set EBNs, (iii) LAST_HIT_NUM subfield 1012, which indicates the number of the TS-RAM search which last matched this trapping set, and (iv) HIT_COUNTER subfield 1014, which records how many times this particular trapping-set profile has been matched to an observed trapping set since this trapping set was stored in TS-RAM.

If a record is a secondary record, then R_WORD field 1006 contains the layer (LAYER field 1016) and index (USC_INDEX field 1018) of a single USC within a trapping set, and the indices (EBN_INDEX field 1020) of one or more EBNs associated with that USC.

Figure 11:
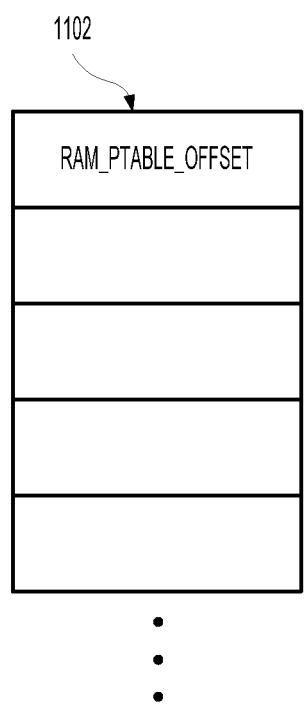
FIG. 11 is an exemplary layout of RAM Index Table 524 of FIG. 5.

FIG. 11 is an exemplary layout of RAM Index Table 524 of FIG. 5. There is a record in RAM Index Table 524 for each trapping set profile in RAM P-Table 522. Each record in RAM Index Table 524 comprises a single field, RAM_PTABLE_OFFSET 1102. RAM_PTABLE_OFFSET 1102 is a pointer to the start of a particular trapping-set profile in RAM P-Table 524, i.e., RAM_PTABLE_OFFSET 1102 contains the record number 1002 of FIG. 10 of a trapping-set profile primary record. The records in RAM Index Table 524 are sorted by dominance, so that the first record in RAM Index Table 524 points to the most-dominant trapping set in RAM P-Table 522, and the last record in RAM Index 524 points to the least-dominant record in RAM P-Table 522.

FIG. 12 is a flowchart of exemplary process 1200 used by LDPC decoding system 500 of FIG. 5. Processing starts at step 1202 and proceeds to step 1204, LDPC decoding of $L_{ch}$ values by LDPC decoder 502 of FIG. 5. If the LDPC decoding at step 1204 yields the DCCW, then process 1200 terminates at step 1218. Otherwise, processing proceeds to step 1206, TS-ROM list decoding (performed by post-processor 504 of FIG. 5).

If step 1206 yields the DCCW, then process 1200 terminates at step 1218. Otherwise, processing proceeds to step 1208, TS-RAM list decoding (performed by post-processor 504 of FIG. 5). If step 1208 yields the DCCW, then process 1200 terminates at step 1218. Otherwise, processing proceeds to one or more additional post-processing methods 1210, 1212, ..., 1214 (performed by post-processor 504 of FIG. 5), which operate in an analogous manner.

If TS-RAM list decoding 1208 or any of the additional post-processing methods 1210, 1212, ..., 1214 yields the DCCW, then processing proceeds to step 1216, where TS-RAM 520 of FIG. 5 is possibly updated by TS-RAM updater 508. Processing then terminates at step 1218.

FIG. 1200 displays one possible sequencing of post-processing methods 1207-1214. Almost any sequence of post-processing methods could be employed, although some sequences are more practical than others. For example, it is desirable to sequence TS-ROM list decoding before TS-RAM list decoding to ensure that trapping sets already stored in ROM are not duplicated in RAM.

TS-ROM List Decoding

FIG. 13 is a flowchart of exemplary TS-ROM list-decoding process 1206 of FIG. 12 implemented by post-processor 504 of FIG. 5. Processing starts at step 1302 and proceeds to step 1304, where process 1206 determines if the number $b_{observed}$ of USCs observed in the vector $\hat{x}$ received from LDPC decoder 1204 of FIG. 12 is greater than 0 and less than the maximum number $b_{max}$ of USCs that can be efficiently handled by process 1206. If $b_{observed}=0$, then there are no USCs in vector $\hat{x}$ (i.e., $\hat{x}$ is a near-codeword mis-correction), and hence there is no trapping set to match. If step 1304 evaluates false, then process 1206 terminates. Otherwise, processing continues to step 1306.

At step 1306, the current state of the decoder is stored and labeled State 1. Processing then continues to step 1308, where the observed USCs are sorted, first by decoding layer, then by index. Next, at step 1310, the following four values are fetched from B-Table 512 of FIG. 5 and stored:

(1) PTABLE_START_OFFSET field 704 of FIG. 7 for $b=b_{observed}$;

(2) PTABLE_START_OFFSET field 704 of FIG. 7 for $b=b_{observed}+1$;

(3) ETABLE_START_OFFSET field 706 of FIG. 7 for $b=b_{observed}$; and (4) NUM_ETABLE_ENTRIES field 708 of FIG. 7 for $b=b_{observed}$.

The first value instructs process 1206 where to begin its search for matching trapping-set information (i.e., USC and EBN indices) in P-Table 514 of FIG. 5, and the second value instructs process 1206 when to end its search. Similarly, the third and fourth values instruct process 1206 where to begin and end its search for extended information (i.e., MSC indices).

Thus, for example, if $b_{observed}=5$, then process 1206 fetches the values of PTABLE_START_OFFSET field 704 of FIG. 7 for b=5 and b=6, and the values of ETABLE_START_OFFSET field 706 of FIG. 7 and NUM_ETABLE_ENTRIES field 708 of FIG. 7 for b=5.

Next, at step 1312, process 1206 selects P-Table 514 of FIG. 5 and goes to the address indicated by the stored value of PTABLE_START_OFFSET for b=$b_{observed}$ Next, at step 1314, TS-ROM is searched for a trapping set which matches the observed USCs.

FIG. 14 is a flowchart of exemplary TS-ROM search process 1314 of FIG. 13. Process 1314 starts at step 1402 and, at step 1404, searches for the next record in P-Table 514 of FIG. 5 which is an isomorphic match for the observed USCs. An isomorphic match for a particular set of observed USCs would be a trapping set where the number of USCs and distances between those USCs are the same as the observed USCs. Thus, if the observed USCs are [1,3,10], then [1,3,10] is a match, and [2,4,11] is an isomorphic match, as are [3,5,12], [4,6,13], and so forth. If no match is found, then process 1314 terminates with a status of no match 1406.

If, instead, a match is found at step 1404, then, at step 1408, the value of EBN_INDEX field 608 of FIG. 6 of the matching P-Table record is stored. The EBN_INDEX field contains the indices of one and perhaps two erroneous bit nodes associated with this matched trapping set.

Next, process 1314 attempts to locate any extended information, i.e., the indices of EBNs associated with mis-satisfied check nodes (MSCs) in this matching trapping set. Extended information is kept in EI-Table 518. However, extended information is not kept for all trapping sets stored in P-Table 514, but only for a subset of trapping sets in each b range. That subset corresponds to the more-dominant trapping sets in a particular b range, i.e., those trapping sets which have a more-significant impact on error-floor characteristics. As discussed above, in P-Table 514, the trapping sets within a particular b range are sorted by dominance; thus, extended information is kept only for the first x records within that b range. The beginning and end of each b range in EI-Table 518 is indicated by the fields ETABLE_START_OFFSET 706 and NUM_ETABLE_ENTRIES 708 in B-Table 512.

Process 1314 maintains an internal count of trapping sets as it searches through the records of ROM P-Table 514. Thus, for example, if process 1314 were searching through b=2 trapping sets in P-Table 514 of FIG. 6, process 1314 would identify records 0 and 1 as trapping set 0 (e.g., trapping set 610 of FIG. 6), records 2 and 3 as trapping set 1 (e.g., trapping set 612 of FIG. 6), and so forth. This trapping-set number is referred to as TSNUM.

At step 1410, TSNUM is compared to the value of NUM_ETABLE_ENTRIES field that was stored in step 1310 of FIG. 13. If TSNUM is greater than the value of NUM_ETABLE_ENTRIES, then no extended information is available, and process 1314 terminates with a status of match, no extended information 1412.

If, instead, at step 1410, TSNUM is found to be less than or equal to the stored value of NUM_ETABLE_ENTRIES, then extended information exists for this matched trapping set. In step 1414, TSNUM is added to the stored value of ETABLE_START_OFFSET to yield variable ETABLE_ENTRY_ADDRESS.

Next, at step 1416, process 1314 selects E-Table 516 of FIG. 5, goes to the record with an address equal to the value of variable ETABLE_ENTRY_ADDRESS, and stores the values of EITABLE_START_ADDRESS field 804 of FIG. 8 and EITABLE_END_ADDRESS field 806 of FIG. 8.

Next, at step 1418, process 1314 selects EI-Table 518 of FIG. 5, and stores the values of the BLOCK_COLUMN fields 904 of FIG. 9 and B_INDEX fields 906 of FIG. 9 of every record between the stored EITABLE_START_ADDRESS and EITABLE_END_ADDRESS values. Finally, process 1314 exits with a status of match with extended information 1420.

Returning to FIG. 13, if step 1314 terminates with a status of no match, then process 1206 terminates at step 1316.

If step 1314 terminates with a status of match, no extended information, then process 1206 possesses the USC indices and some of the EBN indices associated with this trapping set, but no extended information (i.e., indices of EBNs associated with MSCs). In this case, step 1318 flips the bit nodes at those EBN indices, and iterative LDPC decoding is performed at step 1320. The process of step 1320 is the same as process 300 of FIG. 3 except that decoder initialization step 304 and initial syndrome check step 306 are skipped. If step 1320 converges on the DCCW, then process 1206 terminates at step 1316. Otherwise, at step 1322, the decoder is restored to State 1, and a next matching trapping set is sought at step 1314.

If step 1314 terminates with a status of match with extended information, then process 1206 possesses the indices of all the EBNs associated with the matched trapping set. In this case, it is not necessary to perform belief propagation (e.g., steps 310 and 312 of FIG. 3). Instead, at step 1324, the EBNs are flipped, and the resulting vector $\hat{x}$ is submitted to a syndrome check 1326. If vector $\hat{x}$ fails the syndrome check at step 1326, then process 1206 proceeds to step 1322. If, instead, vector $\hat{x}$ passes the syndrome check (i.e., vector $\hat{x}$ is a valid codeword), then, at step 1328, a CRC check is performed on vector $\hat{x}$ to determine if it is in fact the correct codeword. If vector $\hat{x}$ passes CRC check 1328 (i.e., vector $\hat{x}$ is the DCCW), then process 1206 terminates at step 1316. If vector $\hat{x}$ fails CRC check 1328, then process 1206 proceeds to step 1322.

TS-RAM List Decoding

Another PP method utilized by post-processor 504 of FIG. 5 is TS-RAM list decoding 1208 of FIG. 12, i.e., list decoding of trapping sets using trapping-set information stored in volatile memory, such as random-access memory. TS-RAM list decoding is similar to TS-ROM list decoding in that RAM P-Table 522 of FIG. 5 stores USC and EBN information for selected trapping sets. However, unlike ROM P-Table 514, RAM P-Table 522 is altered during run-time by TS-RAM updater 506 of FIG. 5. Hence, only the most-important information is stored, e.g., USC and EBN indices. No extended information (e.g., EI-Table 518 of FIG. 5) is maintained in TS-RAM.

Nor are the profiles in RAM P-Table 522 sorted in any fashion. Instead, a separate RAM Index Table 524 of FIG. 16 maintains a list of the addresses of the trapping-set profiles stored in RAM P-Table 522, sorted by dominance.

FIG. 15 is a flowchart of exemplary TS-RAM list-decoding process 1208 of FIG. 12. Processing begins at step 1502 and proceeds to step 1504, which is identical in purpose and operation to step 1304 of FIG. 13. If step 1504 evaluates false, then process 1208 terminates at step 1506; otherwise, processing continues to step 1508, where the current decoder state is recorded and labeled State 1. Processing then continues to step 1510.

At step 1510, process 1208 goes to the most-dominant trapping-set profile in RAM P-Table 522 of FIG. 5. Specifically, since RAM Index Table 524 ranks the profiles in RAM P-Table 522 by dominance, process 1208 goes to the first record in RAM Index Table 524 and retrieves the value of RAM_PTABLE_OFFSET field 1102 of FIG. 11. Then, process 1208 moves the pointer in RAM P-Table 522 to that stored offset value.

At step 1512, process 1208 increments global variable RAM_SEARCH_COUNT which keeps track of the total number of TS-RAM searches performed, i.e., the total number of times process 1208 has been executed. Also, at step 1512, process 1208 examines the profiles in RAM P-Table 522, in the order indicated by RAM Index Table 524, i.e., in order of decreasing dominance, for an isomorphic match for the observed USCs. If no match is found, then processing continues to step 1514.

If, instead, at step 1512, a match is found, then, at step 1516, the LAST_HIT_NUM field 1012 of FIG. 10 of the matched profile is set to the value of global variable RAM_SEARCH_COUNT, and the HIT_COUNTER field 1014 of FIG. 10 is incremented by 1. Then, at step 1518, the values of EBN_INDEX fields 1020 of FIG. 10 are stored. Step 1520 flips the bit nodes located at the EBN_INDEX values, and, at step 1522, LDPC decoding is performed. Step 1522 is identical to step 1320 of FIG. 13. If decoding process 1522 converges on the DCCW, then processing continues to step 1514; otherwise, at step 1524, the decoder is reset to State 1, and processing then continues to step 1512 where another isomorphic match is sought in P-Table 522.

At step 1514, process 1208 updates RAM Index Table 524 of FIG. 11. Specifically, step 1514 sorts all TS-RAM profiles in RAM P-Table 522 on any combination of fields in RAM P-Table 522, e.g., LAST_HIT_NUM 1012, HIT_COUNTER field 1014, number of USC nodes field 1008, and number of EBNs field 1010. Then the addresses of all the sorted profiles, i.e., record numbers 1002 of all primary records, are stored as records in RAM Index Table 524 of FIG. 11. The profile addresses are stored in RAM Index Table 524 in the same order in which they were sorted in step 1514 (e.g., from most dominant to least dominant).

Once step 1514 has completed, processing terminates at step 1506.

TS-RAM Updater

As explained in the discussion of process 1200 of FIG. 12, if any post-processing method other than TS-ROM list decoding 1206 arrives at the DCCW, that might mean that a new trapping set has been discovered. If so, then step 1216 might attempt to add that new trapping set to RAM P-Table 522 of FIG. 5.

In one embodiment, step 1216 is a low-complexity process for retaining dominant trapping sets in TS-RAM 520. Specifically, in this embodiment, step 1216 does not perform exhaustive calculations to determine dominant trapping sets a priori, such as the calculations performed by DTS-N compiler 422 of FIG. 4, but instead (i) ranks TS-RAM trapping sets on any combination of one or more factors, e.g., how many time TS-RAM has been searched since the trapping set was last matched, the total number of times a trapping set has been matched, the number of USCs, the number of EBNs, etc., and then (ii) purges the lowest-ranked trapping sets to make space for newly-discovered trapping sets. Ranking trapping sets in TS-RAM 520 using these factors is typically considerably less complex than the analysis performed by off-line simulation tools (e.g., compiler 422 of FIG. 4).

FIG. 16 is a flowchart of exemplary TS-RAM update process 1216 of FIG. 12. Processing starts at step 1602 and proceeds to step 1604 where it is determined whether a DCCW was generated by TS-RAM list decoding process 1208 of FIG. 12. If so, then no trapping-set profile needs to be added to TS-RAM, and process 1216 terminates at step 1608.

If, instead, step 1604 evaluates no/false, then it means that some post-processing method other than TS-ROM or TS-RAM list decoding arrived at the DCCW, and thus a new trapping set has been discovered and should be appended to RAM. At step 1610 the trapping-set profile is generated. A trapping-set profile comprises the indices of the trapping-set USBs, and the indices of the EBNs associated with those USBs. The USB indices have already been generated by LDPC decoder 502 of FIG. 5. To generate the EBN indices, step 1610 compares the DCCW $\hat{x}_{pp}$ generated by post-processor 504 to vector $\hat{x}$ generated by LDPC decoder 502.

At step 1612, it is determined whether there is enough free space to append the new trapping-set profile. If so, then, at step 1614, the new trapping-set profile is appended to RAM P-Table 522, and process 1216 proceeds to step 1616.

If, however, at step 1612, there is not enough free space in RAM P-Table 522 to append the new trapping-set profile, then, at step 1618, the lowest-ranked purge-eligible trapping-set profile is purged. In this example, the purge-eligibility of a profile is determined by the number of times RAM has been searched since that profile was last matched, i.e., the value of global variable RAM_SEARCH_COUNT less the value of the profile's LAST_HIT_NUM field. If the number of intervening searches is greater than a specified threshold, then the profile is purge-eligible. Assuming that all profiles are ranked first by purge-eligibility, all purge-eligible records will be at the end of RAM Index Table 524 of FIG. 11.

Thus, at step 1618, the last record in index RAM Index Table 524 is selected, and the value of RAM_PTABLE_OFFSET field 1102 is retrieved. If the profile located in RAM P-Table 522 at the stored offset value (indicated by the retrieved RAM_PTABLE_OFFSET value) is purge-eligible, then the primary record and associated secondary records located at that stored offset value in RAM P-Table 522 are deleted. At step 1620, RAM Index Table MSB is updated, and control then loops back to step 1612, where it is determined whether there is enough free space in RAM P-Table 522 to append the new trapping-set profile. The processing of step 1620 is identical to the processing of step 1514 of FIG. 15.

If, instead, at step 1618, the lowest-ranked profile is not purge-eligible, then processing continues to step 1616. At step 1616, RAM Index Table 523 is updated, and processing terminates at step 1608. The processing of step 1616 is identical to the processing of step 1514 of FIG. 15.

Although the present invention has been described in the context of hard disk drives that implement LDPC coding and decoding, the invention is not so limited. In general, the present invention can be implemented in any suitable communication path that involves LDPC coding and decoding.

Further, although the exemplary belief-propagation algorithm used above is the offset min-sum algorithm (OMS), the present invention is not so limited, and can be used with any belief-propagation variant, e.g., sum-product algorithm (SPA) or the Bahl-Cocke-Jelinek-Raviv (BCJR) algorithm.

Yet further, although the belief-propagation example used above employed a specific decoding schedule (flooding schedule) where all check nodes were updated during a single check-node update step, followed by all bit nodes being updated in a single bit-node update step, the present invention is not so limited, and can be used with any decoding schedule, e.g., row-serial schedule, column-serial schedule, and row-column serial schedule.

Yet further, although the exemplary LDPC decoder used above was a non-layered decoder, the present invention is not so limited, and can be used with both layered and non-layered decoders.

Yet further, although the exemplary TS-RAM implementation given above assumed storing trapping-set profiles in RAM within the read channel of an HD drive, the present invention is not so limited. A RAM P-Table (e.g., 522 of FIG.

5) can also be stored on the platters of an HD drive, or stored in a separate memory such as flash memory.

Yet further, although the exemplary TS-ROM implementation given above is described in the context of read-only memory, the present invention is not so limited. In general, the term "ROM" as used in both the specification and the claims should be interpreted to refer to any data-storage device storing static TS-profile data, whether or not the data in that device is capable of being modified.

Yet further, although embodiments of the present invention have been described in the context of LDPC codes, the present invention is not so limited. Embodiments of the present invention could be implemented for any code which can be defined by a graph, e.g., tornado codes, structured IRA codes, since it is graph-defined codes which suffer from trapping sets.

Although the present invention was described in terms of receiving log-likelihood ratios, the present invention is not so limited. Embodiments of the present invention may be envisioned in which other soft values such as likelihood ratios or hard-decision values are processed.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

I claim:

1. A method for decoding encoded data encoded using a graph-based code, the method comprising:
   (a) decoding the encoded data to generate a candidate decoded codeword; and
   (b) performing, if the candidate decoded codeword is not a decoded correct codeword, a trapping-set (TS)-ROM list decoding method to attempt to generate the decoded correct codeword, wherein:
      the candidate decoded codeword has at least one unsatisfied check node, wherein an unsatisfied check node is a check node that fails a parity check;
      the TS-ROM list decoding method accesses one or more TS profiles stored in ROM memory;
      a first stored TS profile stored in the ROM memory comprises stored information for at least one unsatisfied check (USC) node and stored information for at least one mis-satisfied check (MSC) node, wherein an MSC node is a check node that (i) is associated with erroneous bit nodes (EBNs) and (ii) satisfies the parity check; and
      a second stored TS profile stored in the ROM memory is associated with a trapping set having one or more USC nodes and one or more MSC nodes, wherein the second stored TS profile comprises stored information for the one or more USC nodes, but does not contain information about the one or more MSC nodes.

2. The invention of claim 1, wherein the first stored TS profile is associated with a trapping set that is more dominant than the trapping set of the second stored TS profile.

3. The invention of claim 1, wherein the TS-ROM list decoding method comprises:
   (b1) identifying one or more EBNs associated with the at least one USC node in the candidate decoded codeword;
   (b2) identifying, if (i) the candidate decoded codeword has one or more MSC nodes and (ii) the ROM memory contains information regarding the one or more MSC nodes, one or more EBNs associated with the one or more MSCs;
   (b3) modifying the identified EBNs; and
   (b4) performing further processing, wherein:
      if step (b2) identifies one or more EBNs, then the further processing comprises performing a syndrome check on the modified candidate decoded codeword; and
      if step (b2) does not identify one or more EBNs, then the further processing comprises decoding modified encoded data.

4. The invention of claim 1, where the graph-based code is a Low-Density Parity Check (LDPC) code.

5. The invention of claim 1, wherein:
for each unsatisfied check node in a TS profile, the TS profile comprises:
   a decoding layer in which the unsatisfied check node is located;
   an index for the unsatisfied check node (USC) within the decoding layer; and
   one or more indices for one or more erroneous bit nodes (EBNs) associated with the unsatisfied check node; and
for each mis-satisfied check node in a TS profile, the TS profile comprises:
   location information for one or more erroneous bit nodes associated with the mis-satisfied check node.

6. The invention of claim 5, wherein:
the ROM memory comprises a plurality of stored TS profiles;
the decoding layers, USC indices, and EBN indices for the plurality of stored TS profiles are stored in a first table; and
the location information for the erroneous bit nodes associated with mis-satisfied check nodes is stored in a second table.

7. The invention of claim 6, wherein the ROM memory further comprises a third table and a fourth table, wherein:
the third table identifies addresses in the second table of the location information for the erroneous bit nodes associated with mis-satisfied check nodes for a matched TS profile;
for each group of stored TS profiles having the same number of unsatisfied check nodes in the first table, the fourth table identifies:
   (i) a start address in the first table for the group of stored TS profiles;
   (ii) a number of TS profiles in the group having location information related to mis-satisfied check nodes; and
   (iii) a start address in the third table for the group of stored TS profiles.

8. The invention of claim 6, wherein:
the stored TS profiles are grouped in the first table based on number of unsatisfied check nodes in the stored TS profiles;
the stored TS profiles in each group of stored TS profiles having the same number of unsatisfied check nodes are ordered by TS profile dominance, wherein dominance of a TS profile is dependent on the effect the associated trapping set has on error-floor characteristics for the decoding of step (a).

9. The invention of claim 8, wherein, for each TS profile having multiple unsatisfied check nodes:
the unsatisfied check nodes are grouped in the TS profile by decoding layer; and
the unsatisfied check nodes in a group of unsatisfied check nodes having the same decoding layer are arranged by USC index.

10. An apparatus for decoding encoded data encoded using a graph-based code, the apparatus comprising:
(a) a decoder adapted to decode the encoded data to generate a candidate decoded codeword; and
(b) a post-processor adapted to perform, if the candidate decoded codeword is not a decoded correct codeword, a trapping-set (TS)-ROM list decoding method to attempt to generate the decoded correct codeword, wherein:
   the candidate decoded codeword has at least one unsatisfied check node, wherein an unsatisfied check node is a check node that fails a parity check;
   the TS-ROM list decoding method accesses one or more TS profiles stored in ROM memory;
   a first stored TS profile stored in the ROM memory comprises stored information for at least one unsatisfied check (USC) node and stored information for at least one mis-satisfied check (MSC) node, wherein an MSC node is a check node that (i) is associated with erroneous bit nodes (EBNs) and (ii) satisfies the parity check; and
   a second stored TS profile stored in the ROM memory is associated with a trapping set having one or more USC nodes and one or more MSC nodes, wherein the second stored TS profile comprises stored information for the one or more USC nodes, but does not contain information about the one or more MSC nodes.

11. The invention of claim 10, wherein the first stored TS profile is associated with a trapping set that is more dominant than the trapping set of the second stored TS profile.

12. The invention of claim 10, wherein, for the TS-ROM list decoding method, the post-processor:
(b1) identifies one or more EBNs associated with the at least one USC node in the candidate decoded codeword;
(b2) identifies, if (i) the candidate decoded codeword has one or more MSC nodes and (ii) the ROM memory contains information regarding the one or more MSC nodes, one or more EBNs associated with the one or more MSCs;
(b3) modifies the identified EBNs; and
(b4) performs further processing, wherein:
   if the post-processor identifies one or more EBNs associated with the one or more MSCs, then the post-processor performs a syndrome check on the modified candidate decoded codeword; and
   if the post-processor does not identify one or more EBNs associated with the one or more MSCs, then the post-processor decodes modified encoded data.

13. The invention of claim 10, where the graph-based code is a Low-Density Parity Check (LDPC) code.

14. The invention of claim 10, wherein:
for each unsatisfied check node in a TS profile, the TS profile comprises:
   a decoding layer in which the unsatisfied check node is located;
   an index for the unsatisfied check node (USC) within the decoding layer; and
   one or more indices for one or more erroneous bit nodes (EBNs) associated with the unsatisfied check node; and
for each mis-satisfied check node in a TS profile, the TS profile comprises:
   location information for one or more erroneous bit nodes associated with the mis-satisfied check node.

15. The invention of claim 14, wherein:
the ROM memory comprises a plurality of stored TS profiles;
the decoding layers, USC indices, and EBN indices for the plurality of stored TS profiles are stored in a first table; and
the location information for the erroneous bit nodes associated with mis-satisfied check nodes is stored in a second table.

16. The invention of claim 15, wherein the ROM memory further comprises a third table and a fourth table, wherein:
the third table identifies addresses in the second table of the location information for the erroneous bit nodes associated with mis-satisfied check nodes for a matched TS profile;
for each group of stored TS profiles having the same number of unsatisfied check nodes in the first table, the fourth table identifies:
   (i) a start address in the first table for the group of stored TS profiles;

(ii) a number of TS profiles in the group having location information related to mis-satisfied check nodes; and
(iii) a start address in the third table for the group of stored TS profiles.

17. The invention of claim 15, wherein:

the stored TS profiles are grouped in the first table based on number of unsatisfied check nodes in the stored TS profiles;

the stored TS profiles in each group of stored TS profiles having the same number of unsatisfied check nodes are ordered by TS profile dominance, wherein dominance of a TS profile is dependent on the effect the associated trapping set has on error-floor characteristics for the decoder.

18. The invention of claim 17, wherein, for each TS profile having multiple unsatisfied check nodes:

the unsatisfied check nodes are grouped in the TS profile by decoding layer; and the unsatisfied check nodes in a group of unsatisfied check nodes having the same decoding layer are arranged by USC index.

* * * * *